US006970485B1

(12) United States Patent
Kitayama et al.

(10) Patent No.: US 6,970,485 B1
(45) Date of Patent: Nov. 29, 2005

(54) COOLING DEVICE, SEMICONDUCTOR LASER LIGHT SOURCE DEVICE, SEMICONDUCTOR LASER SOURCE UNIT, METHOD OF MANUFACTURING SEMICONDUCTOR LASER LIGHT SOURCE UNIT AND SOLID STATE LASER DEVICE

(75) Inventors: Jiro Kitayama, Tokyo (JP); Kyoko Fukumura, Tokyo (JP); Mitsuyasu Matsuo, Tokyo (JP); Toru Sugiyama, Tokyo (JP); Youichi Hisamori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 197 days.

(21) Appl. No.: 10/168,181

(22) PCT Filed: Oct. 20, 2000

(86) PCT No.: PCT/JP00/07331

§ 371 (c)(1),
(2), (4) Date: Oct. 25, 2002

(87) PCT Pub. No.: WO02/35666

PCT Pub. Date: May 2, 2002

(51) Int. Cl.[7] ............................................... H01S 3/04
(52) U.S. Cl. ............................ 372/35; 372/34; 372/36
(58) Field of Search ..................... 372/34–36; 216/41; 361/385, 704; 357/74, 81–82; 165/167, 140, 165/166, 153

(56) References Cited

U.S. PATENT DOCUMENTS

| | | |
|---|---|---|
| 5,105,429 A | 4/1992 | Mundinger et al. |
| 5,105,430 A | 4/1992 | Mundinger et al. |
| 5,812,570 A | 9/1998 | Spaeth |
| 6,097,744 A * | 8/2000 | Takigawa et al. ............. 372/34 |
| 6,131,650 A * | 10/2000 | North et al. ................. 165/170 |
| 6,480,514 B1 * | 11/2002 | Lorenzen et al. ............. 372/35 |
| 6,634,421 B2 * | 10/2003 | Ognibene et al. ........... 165/166 |
| 6,643,302 B1 * | 11/2003 | Nishikawa et al. ........... 372/35 |
| 2002/0026999 A1 * | 3/2002 | Wu et al. .................... 165/167 |
| 2004/0110057 A1 * | 6/2004 | Yoshimoto et al. ........... 429/38 |

FOREIGN PATENT DOCUMENTS

| | | |
|---|---|---|
| JP | 16364/1991 | 2/1991 |
| JP | 09-102568 | 4/1997 |
| JP | 10-209531 | 8/1998 |
| JP | 11-087584 | 3/1999 |
| JP | 11-097770 | 4/1999 |

* cited by examiner

*Primary Examiner*—Minsun Oh Harvey
*Assistant Examiner*—Delma R. Flores-Ruiz
(74) *Attorney, Agent, or Firm*—Burns, Doane, Swecker & Mathis, L.L.P.

(57) ABSTRACT

A semiconductor laser light source device and light source unit according to the present invention include a first plate-like member made of metal, to which a semiconductor laser array is joined along the end portion, a second plate-like member made of metal, in which an inlet opening portion, which introduces cooling fluid, and a cooling fluid draining channel, and a third plate-like member made of metal, which is formed along the area corresponding to the end portion and to which at least one cooling channel is provided through which cooling fluid flows in the longitudinal direction of the semiconductor laser array by communicating the cooling fluid introducing channel and the cooling fluid draining channel. Thus, the sectional area of the channel can be larger than that in the construction of the related art and the processing cost is reduced by comparison with the construction of the related art. The problems of blocking path with an extraneous matter and of high-pressure loss due to the path are overcome. Since the channel is provided along the longitudinal direction of the semiconductor laser array, the semiconductor laser array can be cooled efficiently.

15 Claims, 24 Drawing Sheets

FIG.20
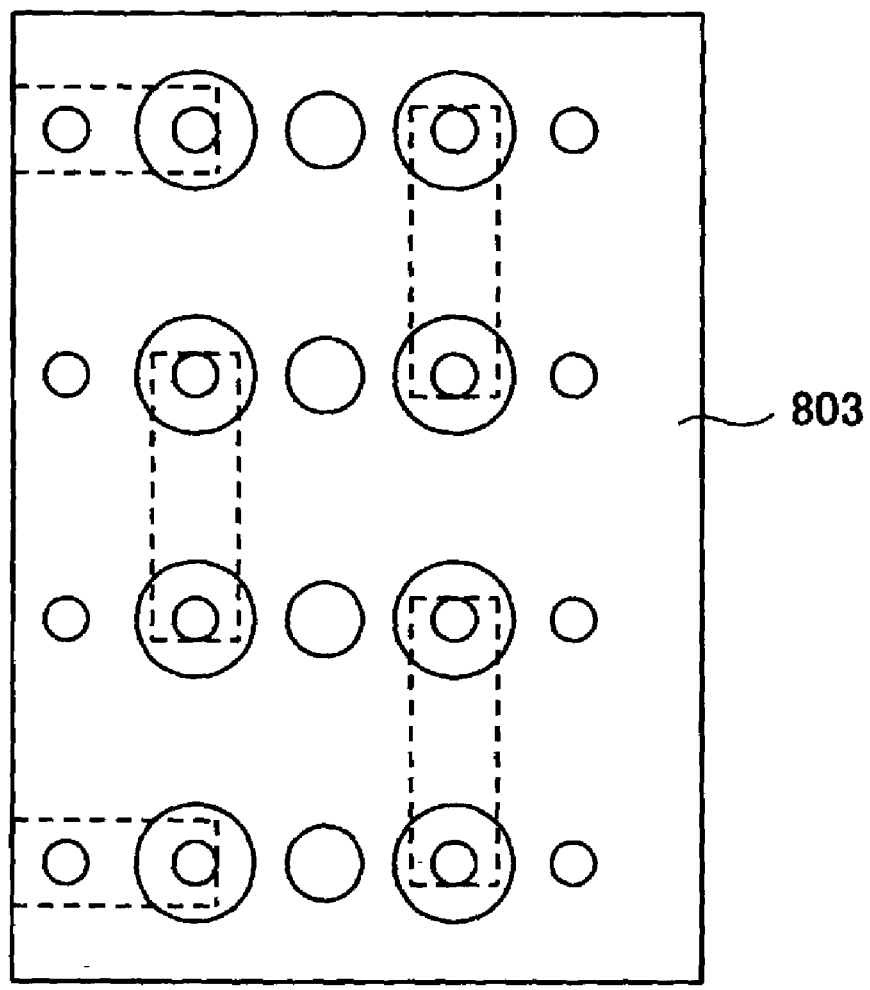
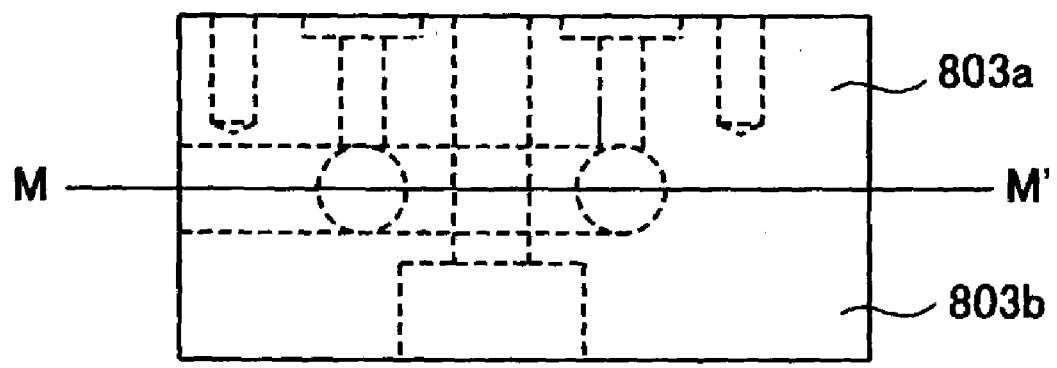

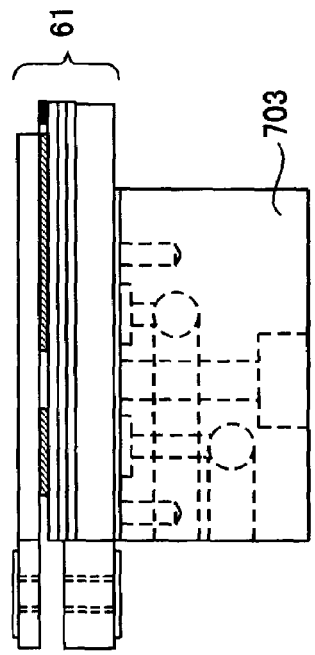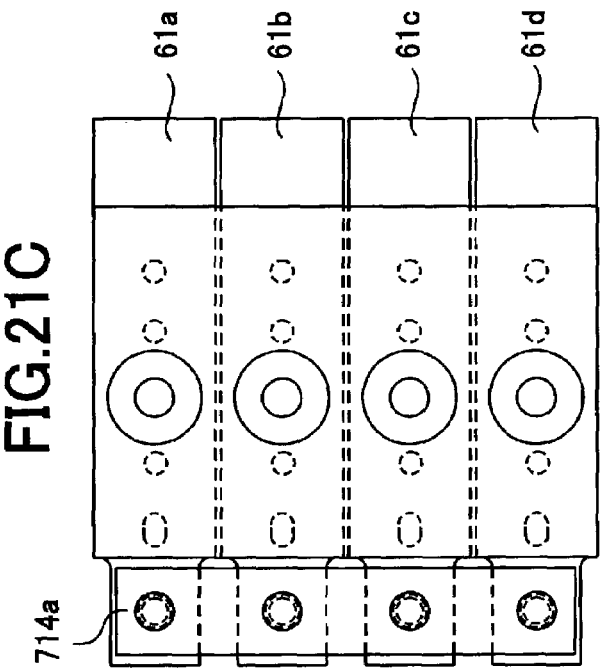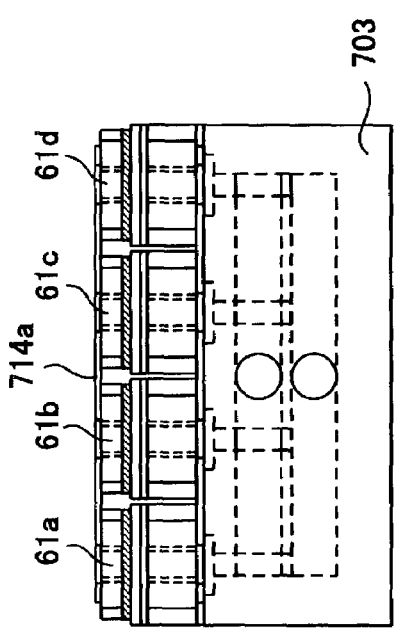

COOLING DEVICE, SEMICONDUCTOR LASER LIGHT SOURCE DEVICE, SEMICONDUCTOR LASER SOURCE UNIT, METHOD OF MANUFACTURING SEMICONDUCTOR LASER LIGHT SOURCE UNIT AND SOLID STATE LASER DEVICE

TECHNICAL FIELD

The present invention generally relates to a cooling device, and more particularly to a cooling device, which forcefully cools a semiconductor laser element with a higher density, a semiconductor laser light source device and semiconductor laser light source unit, both of which have the cooling device, a method of manufacturing the semiconductor laser light source unit, and a solid state laser device.

BACKGROUND ART

A semiconductor laser light source may be used mainly as a light source to be used for pumping a large output solid state laser. While a light source such as a xenon lamp is used for pumping the solid state laser in the related art, the output wavelength generally yields a broad spectrum, which reduces the laser pumping efficiency.

When the pumping is performed by using a semiconductor laser having a sharp wavelength spectrum instead of the light source such as a xenon lamp, lasing can be occurred on the solid state laser with the higher efficiency. A semiconductor laser element to be used as the light source for pumping the large output solid state laser must emit a laser beam at a several tens watt level. However, the output efficiency of the semiconductor laser element is the order of 50% under present circumstances. Therefore, heat is generated which is substantially equal to a laser optical output. Accordingly, in order to obtain a stable laser optical output, a cooling device is needed which cools the semiconductor laser element efficiently.

FIG. 23 shows a construction of the cooling device, which cools a semiconductor laser element in the related art disclosed in U.S. Pat. No. 5,105,429. The cooling device has a construction in which upper and lower lamellas 1 and 3 having paths through which cooling fluid, or fluid, flows, respectively, are laminated on and under a medium lamella 2 formed by an insulator such as glass.

An inlet opening portion 1A and an outlet opening portion 1B are provided for the cooling fluid in the lamella 1. Further, an inlet opening portion 3A and an outlet opening portion 3B are provided for the cooling fluid in the upper lamella 3. A path 1C, which is a path for cooling fluid, having one end communicating with the cooling fluid inlet 1A and the other end branching off to a front end surface 1a, is formed at the top surface of the lamella 1. Furthermore, paths 2A and 2B through which cooling fluid flows are formed in the medium lamella 2 by corresponding to the cooling fluid inlet 1A and the cooling fluid outlet 1B in the lamella 1.

A micro-channel (not shown) is formed at the bottom surface of the upper lamella 3, which communicates with the outlet opening portion 3B along a front end surface 3a and which has a smaller pitch than that of the path 1C. A semiconductor laser array 4 is joined at the top surface of the upper lamella 3 along the front end surface 3a. The micro-channel, not shown, is formed at the bottom surface of the upper lamella 3 and immediately under the semiconductor laser array 4. Here, the semiconductor laser array is defined as an array in which semiconductor lasers each having a light-emitting spot is formed horizontally.

The lower lamella 1, the medium lamella 2 and the upper lamella 3 are laminated and fixed by a bolt and a nut, which is inserted into center opening portions 1D to 3D formed thereon, respectively. The semiconductor laser array 4 is operated by a driving device 5, such as a direct current power supply.

In the cooling device in the related art, a single-crystal silicon (Si) substrate is used as a construction material for the lamellas 1 and 3. The micro-channel 1C and the micro-channel, not shown, of the lamella 3 are formed by using the photo-lithography technology and the etching technology such that they are typically 25 $\mu$m wide and 125 $\mu$m deep. Since it is difficult that a border layer is formed on a path wall in such a narrow micro-channel, the improvement of the cooling efficiency can be expected.

Since, in the cooling device 10 shown in FIG. 23, the micro-channel is formed on the silicon substrate by using the photo-lithography technology and the etching technology, expensive facilities such as an exposure device are needed, which causes a problem of expensive manufacturing costs.

Further, since the cooling device 10 has the silicon substrates, being used as the lamellas 1 and 3, or the insulator lamella 2, such as glass, which are mechanically weak, the cooling device 10 also has a problem in manufacturing yields.

Furthermore, since the lamellas 1 to 3 are mechanically weak, they cannot be fastened tightly when laminated. Therefore, even when a gasket, such as silicon rubber, is used for sealing between the lamellas, water may leak in operations for a long period of time.

The cooling device 10 in FIG. 23 has a problem that laminating the lamellas 1 to 3 increases electric resistance. In the cooling device 10, glass suitable for pasting silicon substrates constructing the upper and bottom lamellas 1 and 3 is used as the medium lamella 2. In addition, silicon rubber is sandwiched between the lamellas in order to seal the lamellas. Therefore, under this condition, it is impossible to electrically connect the lamellas 1 to 3 in series and then to drive the semiconductor laser array 4.

Accordingly, some measures for solving the problems are taken such as metallizing a metal film on the side wall surfaces of the lamellas 1 to 3, using a metal clip, and using conductive silicon rubber containing metal power as the gasket. However, the increase in serial electric resistance cannot be avoided, resulting in increase in Joule's heat generation.

Furthermore, the cooling device 10 in FIG. 23 does not use the other elements than the micro-channels efficiently. Therefore, there is a problem that the cooling efficiency cannot be increased significantly. In other words, in the cooling device 10, silicon is used as a material for the lamellas 1 and 3 in which the micro-channels are formed. However, the thermal conductivity of silicon is smaller than the thermal conductivity of metal. Therefore, it is difficult to remove a heat amount generated by the heat conduction through the lamellas 1 and 3.

Additionally, since glass is used as the medium lamella 2, the heat conduction by the medium lamella 2 itself does not operate very well.

Furthermore, a front end portion 2a of the lamella 2, which is made of glass, is thermally blocked from the other parts by a slot 2C. Therefore, the cooling performance of the front end portion 2a is significantly reduced.

Regardless of the construction, the front end portion 2a of the glass lamella 2 is positioned in the vicinity of the semiconductor laser array 4, which is provided on the lamella 3 thereabove. Therefore, the generated heat mostly reaches to the front end portion 2a of the glass lamella 2.

In other words, the cooling device 10 is designed especially to put a load only on the cooling fluid flowing path, which is formed in the lamella 3 in which the semiconductor laser array is provided. Thus, only the path must have a surface area required for cooling. Therefore, a finer path pattern has to be adopted.

However, such a finer micro-channel is expensive in processing cost, and the path is easily blocked with dust. As a result, the maintenance costs become higher, such as quality control over the cooling fluid.

FIGS. 24A to 24D are perspective diagrams showing an exploded diagrams showing the construction of another cooling device 20 in the prior art, which is disclosed in the Laid-Open Publication No. 1998-209531, and a perspective view showing the cooling device assembled as a semiconductor laser light source device. The cooling device 20 is formed by laminating plate-like members 21 to 23 made of metal such as copper and an alloy of copper with the higher thermal conductivity. An inlet opening portions 21A, 22A and 23A and outlet opening portion 21B, 22B and 23B for cooling fluid or fluid are formed in the plate-like members 21 to 23, respectively.

Each of the plate-like members 21–23 is typically 250 $\mu$m thick. Parallel channels 21C, which function as paths for cooling fluid, are formed 400 to 500 $\mu$m pitch, 130 $\mu$m deep, and 300 to 350 nm wide along a front end portion 21a on the top surface of the plate-like member 21. The channels 21C are shaped along ridges 21c. The ridges 21c extend toward the cooling fluid inlet 21A.

As a result, ridges 21D, which are converged from the ridges 21C toward the inlet 21A, are formed. That is, the cooling fluid introduced from the inlet 21A extends along the ridges 21D and is introduced to the ridges 21C, which are adjacent to the front end surface 21a.

As shown in FIG. 24(d), the plate-like member 22 is laminated on the plate-like member 21 such that it can aligned with the opening portions 21A and 21B, which correspond to the opening portions 22A and 22B. Multiple through holes 22C are formed on the plate-like member 22 along a front end surface 22a by corresponding to the channels 21C on the plate-like member 21, respectively. As a result, the cooling fluid introduced to the channels 21C reaches to the upper side of the plate-like member 22 via the corresponding opening portion 22C.

The plate-like member 23 is provided on the upper side of the plate-like member 22. The plate-like member 23 can be obtained by providing and turning a member identical to the plate-like member 21 upside down on the plate-like member 22. Channels similar to the channels 21C and 21D on the plate-like member 21 are formed on the bottom surface.

However, channels corresponding to the channels 21D are converged to the outlet opening portion 23B. The cooling fluid flowing through the through holes 22C in the plate-like member 22 reaches to the outlet opening portion 23B from channels corresponding to channels 21C provided in the plate-like member 23 through the channels corresponding to the channels 21D.

In the cooling device 20 in the related art, which is shown in FIG. 24, paths in the plate-like members 21 to 23 are formed only by chemically etching channels, without the use of the lithography technology and/or the laser beam processing, for example. Therefore, the cooling device can be manufactured in the inexpensive manner.

Further, a material with higher thermal conductivity, such as copper or an alloy of copper is used as the material of the lamella member. Therefore, the load is not put only on the cooling fluid flowing paths, but a thermally integral structure having a larger thermal capacity can be formed.

In the cooling device 20 in FIG. 24, multiple through holes, which are independent from each other, are formed instead of the continuous slits 1C in the cooling device 10 in the related art, which is shown in FIG. 23. Therefore, the cooling device 20 is not divided into two areas, which are thermally blocked. Thus, the heat can be scattered and lost immediately from one area to the other area through a cross-linking portion between adjacent through holes.

Additionally, the path for cooling fluid is a channel having a larger section than that of the micro-channel. Therefore, the maintenance such as water quality control can be performed easily.

In the cooling device 20 in FIG. 24, channels are formed by using the chemical etching technology, and the cooling device 20 is essentially constructed so as to have a thermally integral structure by using metal members with the higher thermal conductivity. Therefore, the problem of putting loads only on the cooling fluid flowing paths, which is caused by the cooling device 10 in the related art in FIG. 23, can be overcome.

Nevertheless, the sectional dimensions of the channels 21C formed on the top surface of the plate-like member 21 along the front-end portion 21a and the channels 21D converging to the cooling fluid inlet 21A are defined by the thickness of the plate-like members. Especially, the depth of the channels is only about half of the thickness of the plate-like members. As a result, the paths still have fine dimensions. Therefore, the problem of blocking the paths with dust in cooling fluid is not completely solved, and the precise water quality control is still required.

The variation in the width and depth of paths formed by chemical etching causes the variation in path resistance in the multiple channels 21D. The cooling fluid introduced from the cooling fluid inlet 21A to multiple through holes 22C may not be distributed uniformly. Thus, the semiconductor laser array provided on the top surface of the lamella 23 may not be cooled uniformly in the longitudinal direction. In this case, the temperature difference in the semiconductor laser array is generated. The effect of the temperature dependency of band gap energy results in a problem of uneven output wavelength among semiconductor lasers, which construct the semiconductor laser array.

As described above, since it is difficult to have the large path section from the cooling fluid inlet 21A to the cooling fluid outlet 23B, the pressure loss in the cooling device 20 itself is increased. Therefore, the capacity of a feeding unit for feeding a desired amount of flowing cooling fluid is increased, which also increases the device cost.

It is an object of the present invention to provide a novel and useful cooling device, a semiconductor laser light source device including the cooling device and a semiconductor laser light source unit, which solve the problems in the cooling device in the related art.

DISCLOSURE OF INVENTION

A cooling device according to the present invention includes a first plate-like member made of metal, to which a cooled body is joined along the predetermined end portion, a second plate-like member made of metal, in which a cooling fluid introducing channel provided so as to reach an inlet opening portion, which introduces cooling fluid, and one end of an area connected to the inlet opening portion and corresponding to the end portion and a cooling fluid draining channel provided so as to reach an outlet opening portion, which drains cooling fluid, and the other end of the area connected to the outlet opening portion and corresponding to the end portion are formed, and a third plate-like member made of metal, which is formed along the area corresponding to the end portion and to which at least one cooling channel is provided through which cooling fluid flows in the longitudinal direction of the cooled body by communicating the cooling fluid introducing channel and the cooling fluid draining channel. Thus, the sectional area of the channel can be larger than that in the construction of the related art and the processing cost is reduced by comparison with the construction of the related art. The problems of blocking path with an extraneous matter and of high-pressure loss due to the path are overcome. Since the channel is provided along the longitudinal direction of the semiconductor laser array, the semiconductor laser array can be cooled efficiently.

Further, the plate-like member may be laminated alternately a plurality of times. The increase in the number of laminating layers allows more efficient cooling to be performed on the cooled body.

Furthermore, the second plate-like member may have a plurality of cooling channels provided in the vertical direction with respect to the longitudinal direction of the cooled body. As a result, the cooled body can be cooled efficiently by using the plurality channels each having larger sectional area than that in the construction of the related art.

In addition, a length of the plurality of cooling channels of the second plate-like member and a width of the plurality of cooling channels as a whole of the third plate-like member may be substantially equal. Thus, the cooled body can be cooled efficiently.

The cooling device according to the present invention further includes a first plate-like member formed by metal, to which a cooled body is joined along the predetermined end portion, a second plate-like member formed by metal, in which cooling fluid introducing channels each provided so as to reach an inlet opening portion, which introduces cooling fluid, and one end of an area connected to the inlet opening portion and corresponding to the end portion, cooling fluid draining channels each provided so as to reach an outlet opening portion, which drains cooling fluid, and the other end of the area connected to the outlet opening portion and corresponding to the end portion, cooling channels communicating from the one end to the other end of the area corresponding to the longitudinal direction of the cooled body, and branching dividers each having a gap at one end of the cooling channel are provided alternately, and which cools the cooled body by flowing cooling fluid through the cooling channels, and a third plate-like member to which a cooling channel is provided, having dividers positioned such that positions of the gaps are alternate and overlapped with the dividers in the second plate-like member when the third plate-like member is laminated with the second plate-like member. Thus, the branching dividers function as a cooling fin, and the cooled body can be cooled efficiently.

Furthermore, the second plate-like member and the third plate-like member may be laminated alternately a plurality of times. Thus, the cooled body can be cooled more efficiently.

A semiconductor laser light source device according to the present invention includes a semiconductor laser, which is a cooled body. Thus, the semiconductor laser can be cooled efficiently by the cooling device according to the present invention, and laser light having uniform output wavelength can be obtained.

In the semiconductor laser light source device according to the present invention, a submount constructed by using an alloy of copper (Cu) and high melting point metal may be mounted between the semiconductor laser and the first plate-like member. Thus, the difference in linear thermal expansion coefficient among the semiconductor laser and the plate-like member can be reduced. Then, the distortion occurred in the semiconductor laser array can be suppressed, which allows stable operations over a long period of time.

Further, a semiconductor laser light source device according to the present invention may include a first feeding plate-like member, which is attached under the cooling device and which has a first feeding terminal, and a second feeding plate-like member, which is fixed on the cooling device through an insulator and which has one end having a lamella made of metal electrically connected to the top portion of the semiconductor laser and has the other end to which a second feeding terminal is provided. Thus, the semiconductor laser light source device having small electric resistance can be obtained.

A semiconductor laser light source unit according to the present invention includes the semiconductor laser light source device, and a cooling fluid manifold attached to the cooling device through a seal member by using a fastening member for supplying cooling fluid to the cooling device. Thus, a member for aligning and fixing the semiconductor laser light source device also functions as a cooling manifold, which distributes and collects cooling fluid to/from the aligned semiconductor laser light source devices. Therefore, a thin and compact semiconductor laser light source unit can be constructed.

The plurality of semiconductor laser light source devices may be arranged. Thus, more cooling devices can be cooled sufficiently and efficiently, and the plurality of semiconductor laser light source devices can be driven.

The semiconductor laser light source unit may further includes a first load-dispatching board, which is cross-linked so as to electrically connect the plurality of first feeding terminals of the plurality of cooling devices, and a second load-dispatching board, which is cross-linked so as to electrically connecting the plurality of second feeding terminals. The semiconductor laser light source unit with good cooling efficiency, allowing easier feeding, can be obtained.

The cooling fluid may flow independently from the plurality of cooling devices. Thus, the semiconductor laser light source unit, which can cool it efficiently, can be obtained.

Furthermore, the cooling fluid may flow through each of the cooling devices sequentially among the plurality of cooling devices. Thus, the semiconductor laser light source unit, which can cool it efficiently, can be obtained.

The semiconductor laser light source unit according to the present invention is manufactured by using a method of manufacturing a cooling device, including the steps of forming predetermined channels in plate-like members, respectively, by chemical etching, attaching a plurality of plate-like members in a laminate to each other, joining a cooled body onto the laminate of the plate-like members, and fixing the laminate including the plate-like members and a cooling manifold through a joining pin. The semiconductor laser light source unit can be manufactured precisely and efficiently.

A solid state laser device may be constructed by attaching the semiconductor laser light source unit. In this case, the solid state laser is pumped by laser light emitted from a semiconductor laser array having extremely stable output wavelength. Thus, efficient and stable optical outputs can be obtained.

BRIEF DESCRIPTION OF THE DRAWINGS

FIG. 2A is a sectional view taken in the direction of the arrows substantially along the line A–A' of FIG. 1 while

FIG. 4A is a sectional view taken in the direction of the arrows substantially along the line C–C' of FIG. 3, while

FIG. 6A is a sectional view taken in the direction of the arrows substantially along the line E–E' of FIG. 5, while

FIG. 8A is a sectional view taken in the direction of the arrows substantially along the line G–G' of FIG. 7, while

FIG. 10A is a sectional view taken in the direction of the arrows substantially along the line I–I' of FIG. 9, while

FIG. 12A is a sectional view taken in the direction of the arrows substantially along the line K–K' of FIG. 11, while

FIG. 15A is a top view, 15B is an elevation view, and 15C is a bottom surface view.

FIG. 17A is a top view, 17B is an elevation view, and 17C is a bottom surface view.

FIG. 18A is a back surface view, 18B is an elevation view, and 15C is a bottom surface view.

FIG. 20 is a diagram showing the structure of paths of a cooling fluid manifold, which is used for a semiconductor laser light source unit according to embodiment 9 of the present invention.

FIGS. 21A to 21C are external views of the construction of a semiconductor laser light source device according to embodiment 10 of the present invention, and, more specifically, FIG. 21A is a back surface view, 21B is an elevation view, and 21C is a bottom surface view.

BEST MODE FOR CARRYING OUT THE INVENTION

The present invention will be described in detail in accordance with the attached diagram.

Embodiment 1

Figure 1A:
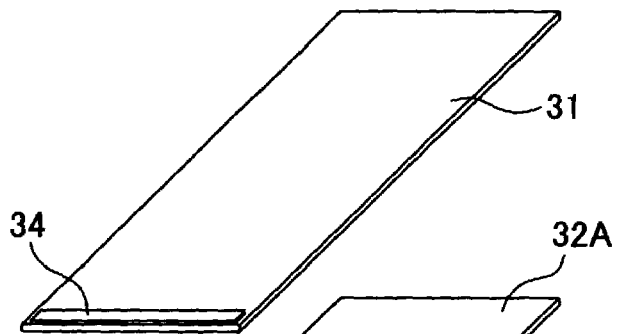
FIGS. 1A to 1D are exploded views each showing the construction of a cooling device according to embodiment 1 of the present invention.
Figure 1B:
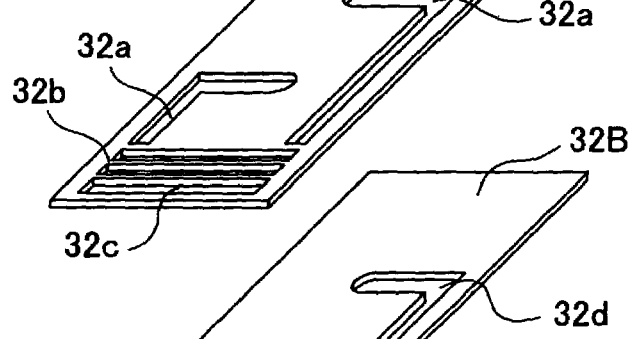
Figure 1C:
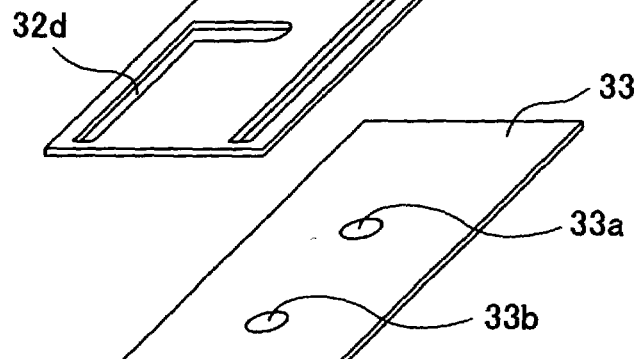
Figure 1D:
Figure 1E:
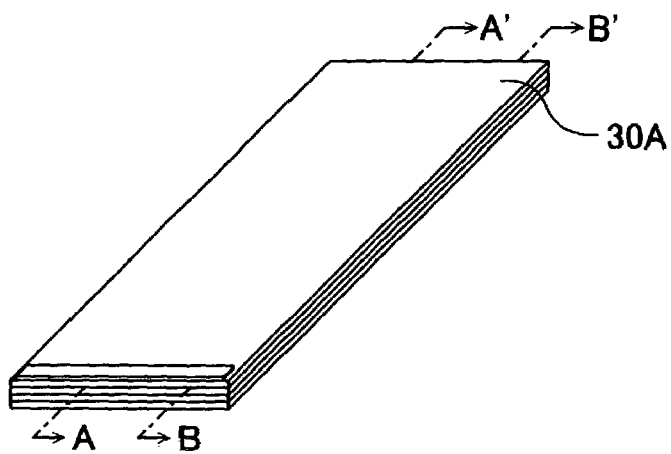
FIG. 1E is a perspective view showing a laminate constructed by members in FIGS. 1A to 1D.

FIGS. 1A to 1D are exploded views each showing the construction of a cooling device 30A according to embodiment 1 of the present invention, and FIG. 1E is a perspective view showing a laminate constructed by members in FIGS. 1A to 1D. In FIGS. 1A to 1E, 31 refers to a plate-like member made of metal to which a semiconductor laser array 34, which is a cooled body, is connected. 32A and 32B refer to plate-like members in each of which a cooling channel functioning as a path for cooling fluid is formed. 33 refers to a plate-like member in which opening portions 33a and 33b are formed as a cooling fluid outlet and a cooling fluid inlet.

The thickness of the plate-like members 31 to 33 is determined based on the thickness of a laminate, the number of laminated layers, a pattern of a channel for constructing a cooling fluid flowing path, and so on. Typically, plate-like members in the order of 100 to 500 µm thick are selected, respectively.

Channels 32a and 32d, which function as paths for cooling fluid introduced and drained from the cooling fluid outlet and inlet 33a and 33b formed in the plate-like member 33, are formed in the plate-like members 32A and 32B. Further, multiple (two in FIG. 1) dividers 32b are formed in the plate-like member 32A in the longitudinal direction of the semiconductor laser array 34 near a position immediately under the semiconductor laser array jointed on the plate-like member 31. Multiple cooling channels 32c (three in FIG. 1), which are formed by the dividers 32b, function as multiple cooling fluid flowing paths in the longitudinal direction of the semiconductor laser array 34.

The plate-like members 31 to 33 are laminated and joined by using the publicly known liquid diffusion bonding method, for example, to obtain the cooling device 30A, as shown in FIG. 1E, in which an internal path is formed. In the cooling device 30A, the plate-like member 32 forming the path is thermally and mechanically connected with the upper and the lower plate-like members 31 and 33.

Figure 2A:
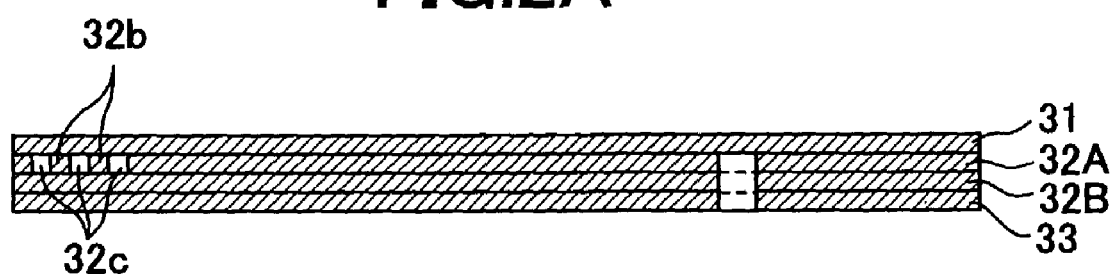
Figure 2B:
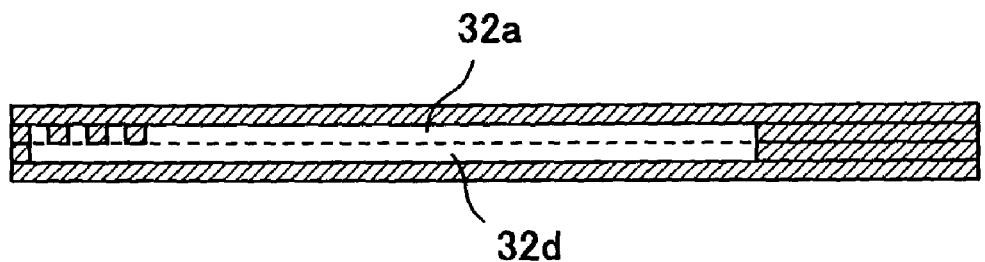
FIG. 2B is a sectional view taken in the direction of the arrows substantially along the line B–B' of FIG. 1.

FIG. 2A is a sectional view taken on a center axis of the cooling device 30A, that is, a sectional view taken in the direction of the arrows substantially along the line A–A' of FIG. 1. FIG. 2B is a sectional view taken along the channels 32a and 32d functioning as the cooling fluid flowing paths in the cooling device 30, that is, a sectional view taken in the direction of the arrows substantially along the line B–B' of FIG. 1. As shown in FIG. 2A, the path in a place near the center axis, where the channels 32a and 32d used as the cooling fluid flowing paths are not formed, is divided into the smaller cooling fluid channels 32c by the dividers 32b. In addition, the dividers 32b are mechanically and thermally connected with the upper and the lower plate-like members 31 and 32B.

The dimensions of a typical section of the channel according to the present invention are substantially 2 mm wide and 100 to 500 $\mu$m deep, which is the same as that of the plate-like member 32. The dimensions are much larger than the dimensions, which are 25 $\mu$m wide and 125 $\mu$m deep, of the micro-channel in the example of the related art.

Next, an operation of the cooling device 30A will be described. The cooling fluid introduced from the cooling fluid inlet 33a provided in the plate-like member 33 is led to the multiple cooling channels 32c, which are formed in the longitudinal direction of the semiconductor laser array 34 near a position immediately under the semiconductor laser array 34 joined on the plate-like member 31, through the channel 32d and the channel 32a formed in the plate-like members 32A and 32B.

The cooling fluid introduced to the cooling channels 32c flows in the longitudinal direction of the semiconductor laser array 34. After the cooling fluid flows through the channels 32a and 32d formed on the other sides of the plate-like members 32A and 32B, the cooling fluid is drained from the cooling fluid outlet 33b in the plate-like member 33.

In the cooling device 30A, heat generated from the semiconductor laser array 34 is expanded and is conducted in the direction adjacent to the cooling fluid inlet and outlet opening portions in the plate-like member 31. At the same time, the heat is also conducted to the adjacent plate-like members 32A and 32B from the plate-like member 31. Further, the heat reaching the plate-like member 32 is conducted through the plate-like members 32A and 32B, and, at the same time, is also conducted to the adjacent plate-like member 33.

In this embodiment, the dividers 32b for dividing each of the cooling fluid flowing paths into multiple paths are provided in the front end portion to which the largest amount of heat is conducted from the semiconductor laser array 34 by means of the plate-like member 32A. The dividers 32b are thermally connected with the upper and the lower plate-like members 31 and 33, and the dividers 32b themselves also serve as cooling fins. Therefore, the heat can be conducted to the cooling fluid efficiently and then is removed to the outside of the cooling device 30A when the cooling fluid is drained.

In this way, the cooling device 30A is essentially constructed as a thermally integral structure. As a result, the heat generated from the semiconductor laser array 34 is efficiently conducted in a three-dimensional manner and is removed by the cooling fluid flowing the cooling device 30A. Therefore, efficient cooling is possible.

Further, the laminate constructing the cooling device 30A is only made of metal. Therefore, the electric resistance of the semiconductor laser light source device is reduced, which can suppress the unnecessary Joule's heat generation. Further, the laminate and the internal cooling fluid flowing path thereof are integrated by using the liquid diffusion bonding method or the like. Therefore, the problem of leaking the cooling fluid can be avoided even over a long period of time.

Since the thermal resistance within the cooling device 30A is small as described above, any significantly fine path is not necessary to form. The channel 32a, for example, to be used as the cooling fluid flowing path can be formed by using an inexpensive manufacturing method such as the chemical etching. There is a merit of higher flexibility in the path design. In this way, since the channel having the larger section than that of the micro-channel can be formed, the water quality control such as dust removal can be performed easily.

Furthermore, the cooling fluid flowing path is formed such that the flow of the cooling fluid can match with the longitudinal direction of the semiconductor laser array 34. Therefore, uneven cooling does not occur which is due to the unbalanced flowing amount of the cooling fluid caused by the variation in dimensions of the path section, as occurred in the cooling device of the related art.

Even when a part of the path is blocked with dust, extremely uneven cooling does not occur since the cooling fluid flows along the longitudinal direction of the cooled body by using the multiple cooling channels 32c.

The cooling device 30A in this embodiment is shown as having the construction where the channel 32a for introducing or draining the cooling fluid is formed in the plate-like member 32A. However, the cooling fluid can be introduced or drained only by using the channel 32d, which is formed in the plate-like member 32B. Therefore, a large amount of cooling fluid is not required. When the pressure loss within the cooling device 30A is not a problem, the channel 32a is not especially necessary to form.

Figure 3:
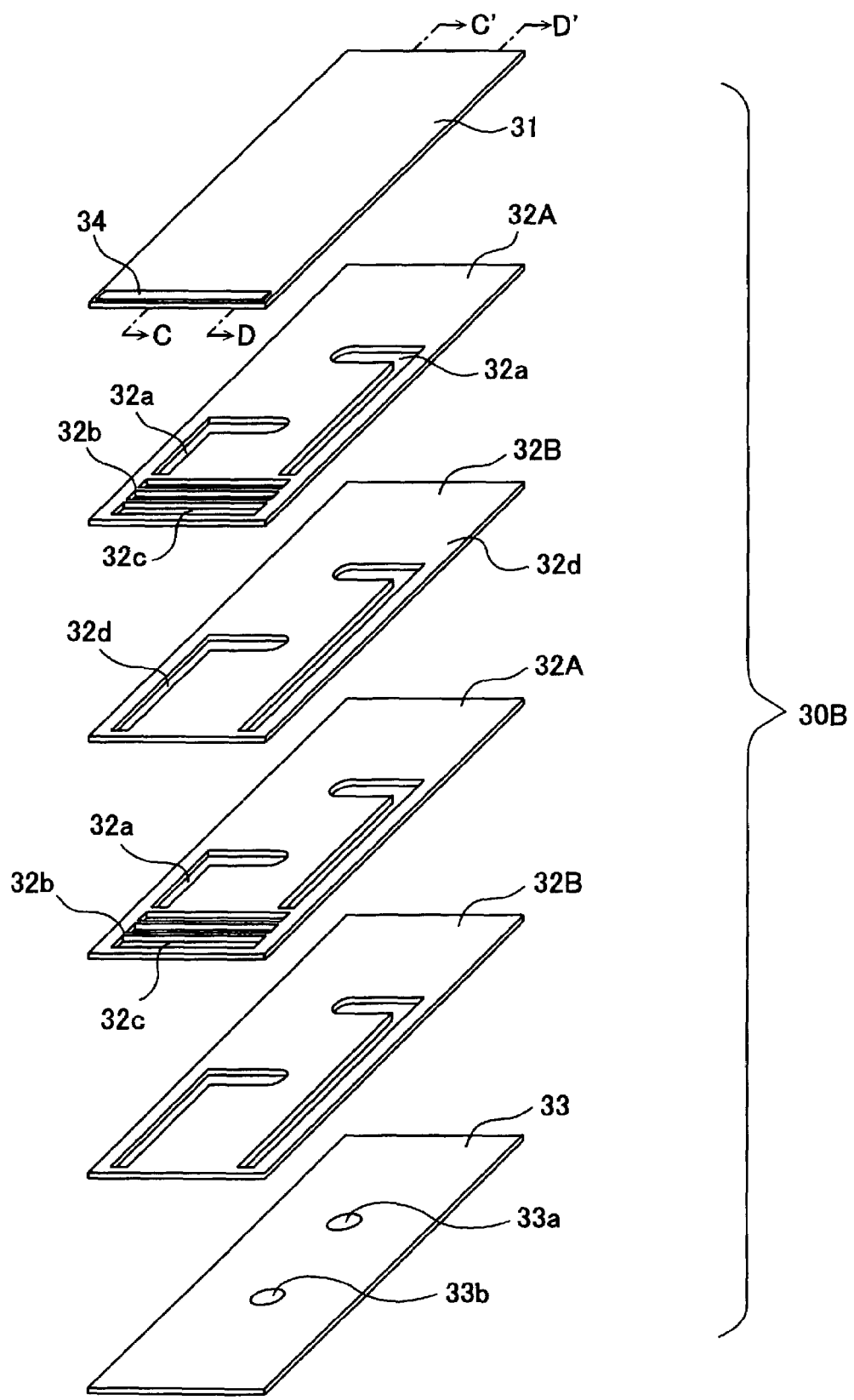
FIG. 3 is an exploded view showing the construction of another cooling device according to embodiment 1 of the present invention.

The cooling device 30A in FIG. 1 is shown as having a construction where one plate-like member 32A and one plate-like member 32B are laminated in which a channel functioning as a cooling fluid flowing path is formed. However, as shown in FIG. 3, it can be constructed like the cooling device structure 30B in which multiple plate-like members 32A and plate-like members 32B are laminated alternately. By increasing the number of laminates, the semiconductor laser array 34, that is a cooled body, can be cooled efficiently.

Figure 4A:
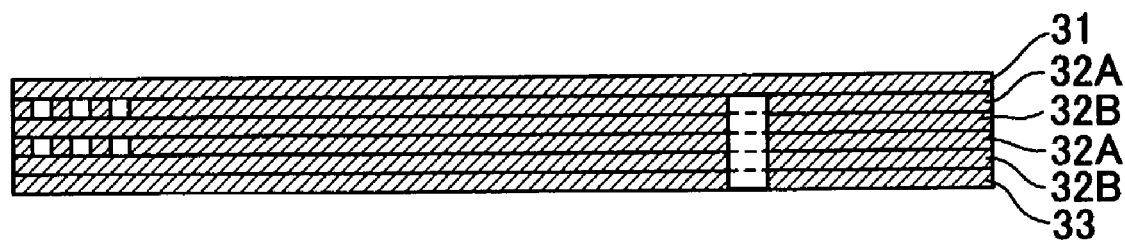
Figure 4B:
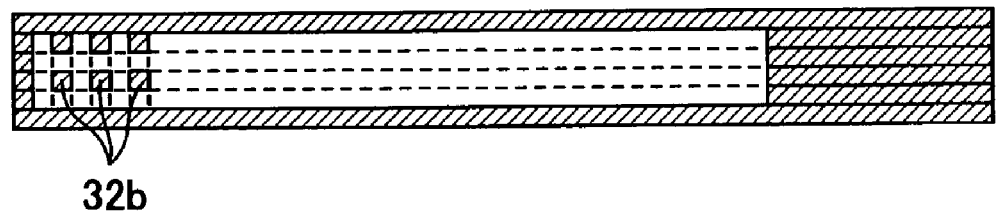
FIG. 4B is a sectional view taken in the direction of the arrows substantially along the line D–D' of FIG. 3.

FIG. 4A is a sectional view taken along a center axis of the laminate 30B when two plate-like members 32A and two plate-like members 32B are laminated, that is, a sectional view taken in the direction of the arrows substantially along the line C–C' when the plate-like members in FIG. 3 are laminated. FIG. 4B is a sectional view taken along the channel 32a and the channel 32d, which function as the cooling fluid flowing path of the laminate 30B, that is, a sectional view taken in the direction of the arrows substantially along the line D–D' when the plate-like members in FIG. 3 are laminated.

Accordingly, when multiple sets of the plate-like members 32A and 32B are laminated, the channel 32a must be formed for introducing or for draining the cooling fluid to/from the plate-like member 32A.

Embodiment 2

In embodiment 1, a channel functioning as a cooling fluid flowing path is not formed in the plate-like member 32B at a position near a bottom surface of a position to which the semiconductor laser array 34 is connected. However, as shown in FIG. 5, a cooling channel 32e in slit shape, which is perpendicular to the flow of the cooling fluid in the cooling channel 32c of the plate-like member 32A may be formed in the plate-like member 32C at predetermined intervals.

Figure 5:
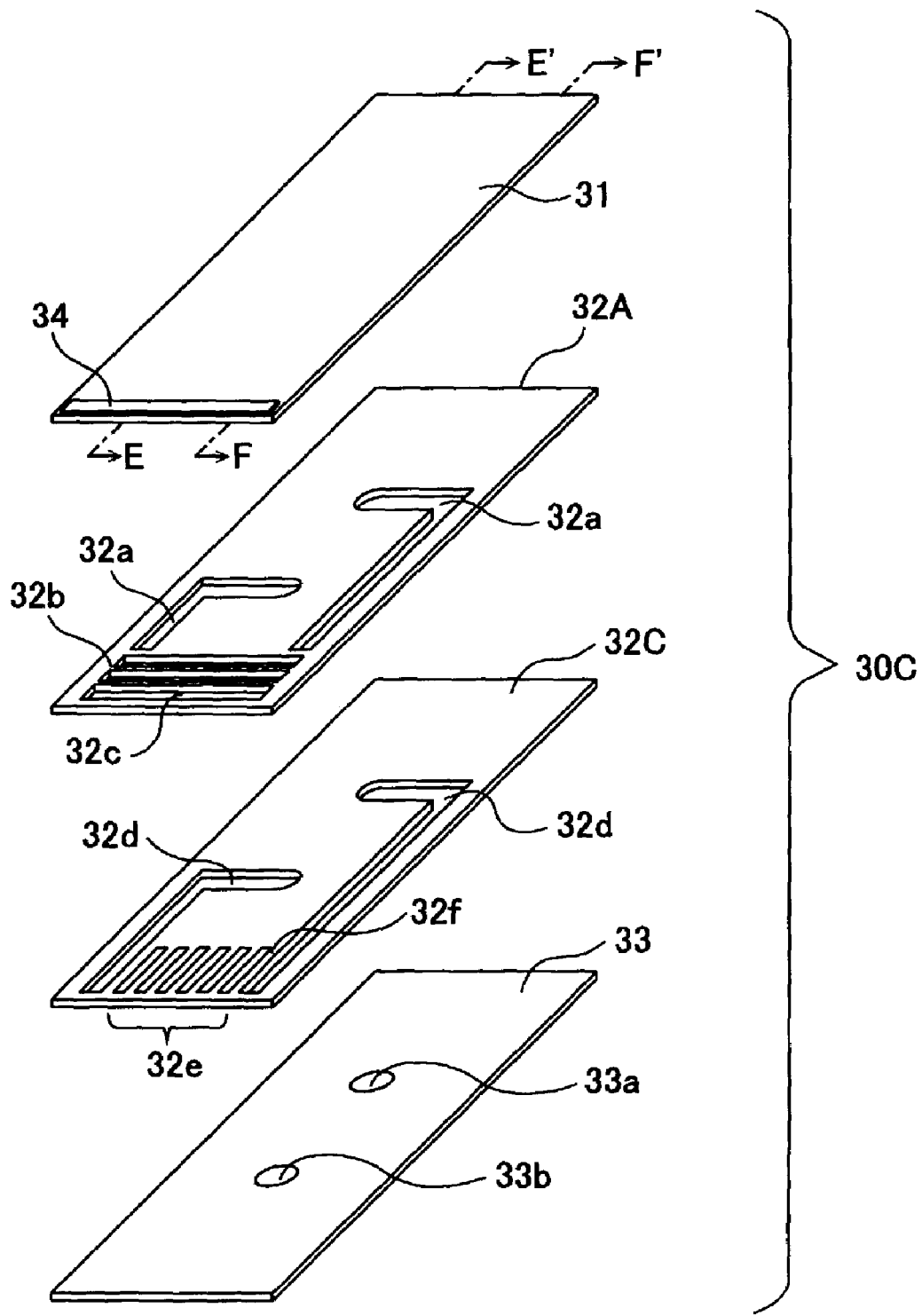
FIG. 5 is an exploded view showing the construction of a cooling device according to embodiment 2 of the present invention.
Figure 6A:
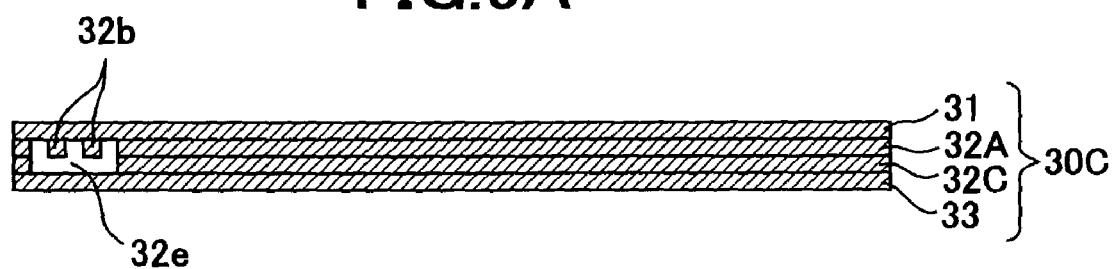
Figure 6B:
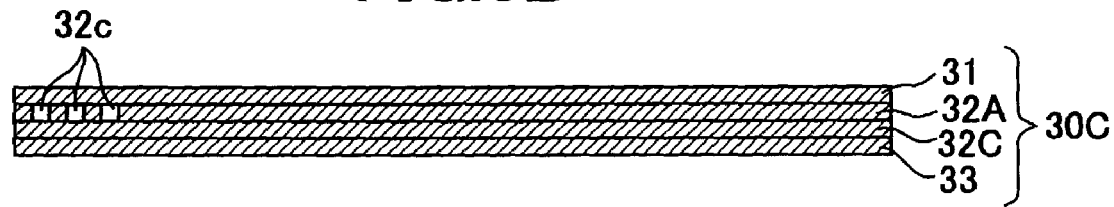
FIG. 6B is a sectional view taken in the direction of the arrows substantially along the line F–F' of FIG. 5.

FIG. 6A is a sectional view of a cooling fluid flowing path at a position where the cooling channel 32e in slit shape is formed in the cooling device 30C formed by using the plate-like member 32C, that is, a sectional view taken in the direction of the arrows substantially along the line E–E' when plate-like members in FIG. 5 are laminated. FIG. 6B is a sectional view of a cooling fluid flowing path at a position where a divider 32f exists between adjacent, slit-shape cooling channels 32e, that is, a sectional view taken in the direction of the arrows substantially along the line F–F' when plate-like members in FIG. 5 are laminated.

The multiple slit-shape cooling channels 32e are aligned in predetermined intervals along the longitudinal direction of the semiconductor laser array 34. Therefore, the path shown in FIG. 6A has a length of the cooling fluid flowing path, which is equal to the width of the slit-shape cooling channel 32e, in the vertical direction of FIG. 6A. The path shown in FIG. 6B has a length of the cooling fluid flowing path, which is equal to the width of the divider 32f, which is formed between slit-shape cooling channel adjacent to the vertical direction of the FIG. 6B. Such paths are repeated alternately in accordance with the number of the slit-shape cooling channels 32e. In other words, the cooling fluid introduced to the cooling device 30C flows alternately and repeatedly through sections shown in FIGS. 6A and 6B in accordance with the number of the slit-shape cooling channels 32e, which are formed in the plate-like member 32B.

In the cooling device 30C in which the path is formed, the same effect can be obtained as that of the cooling device according to embodiment 1. Additionally, the shape of the section of the cooling fluid flowing path at the lower surface of the position to which the semiconductor laser array 34 is connected varies repeatedly in intervals each corresponding to the width of the slit-shape cooling channel 32e and the divider 32f. Thus, the flow of the cooling fluid is effectively agitated. By suppressing the formation of border layers, the cooling efficiency can be further improved.

Figure 7:
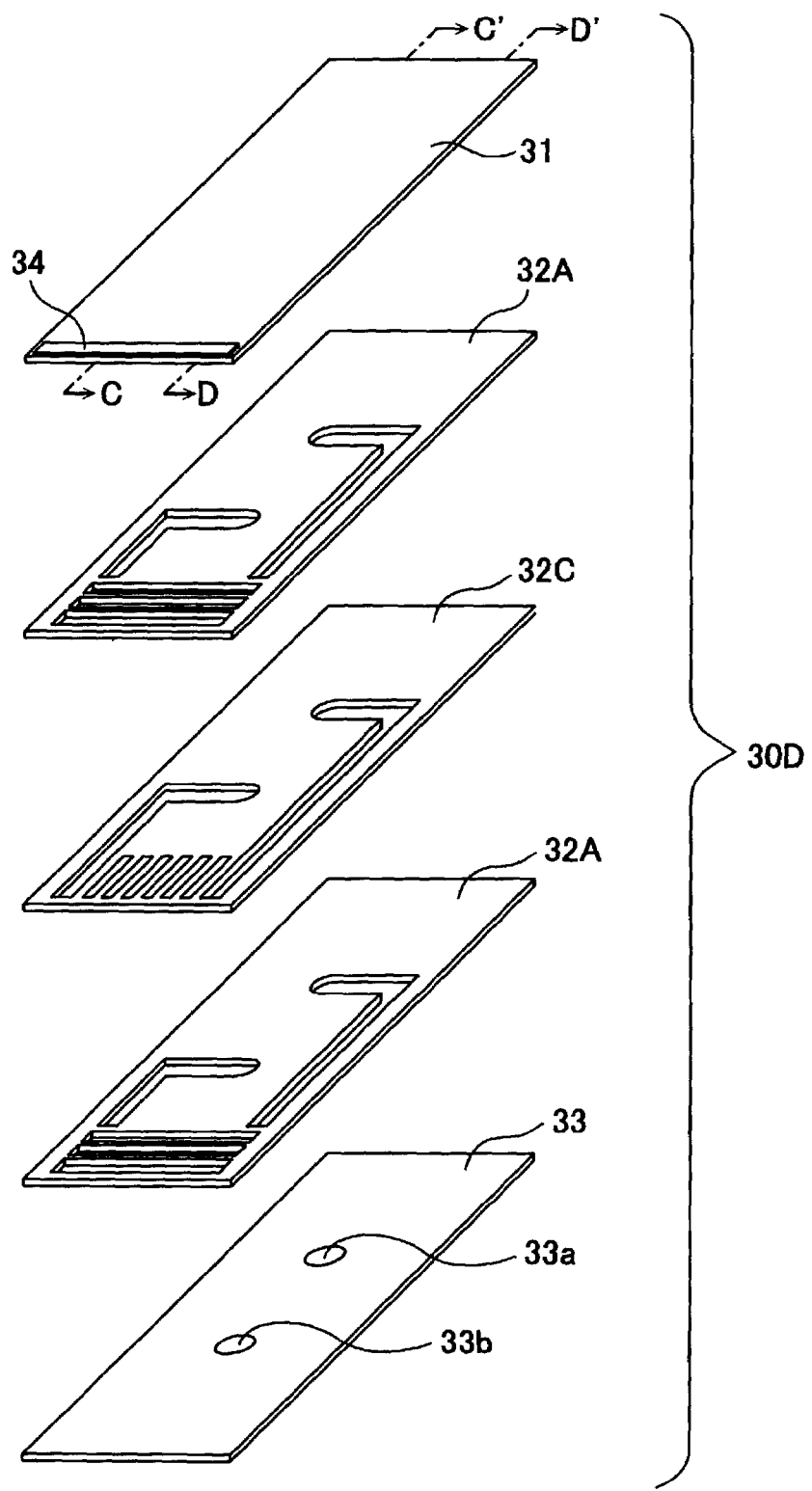
FIG. 7 is an exploded view showing the construction of another cooling device according to embodiment 1 of the present invention.
Figure 8A:
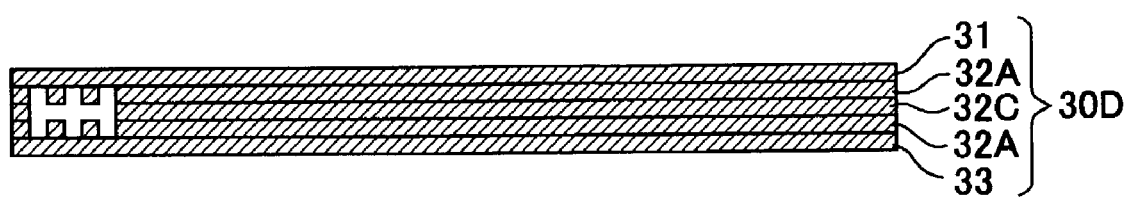
Figure 8B:
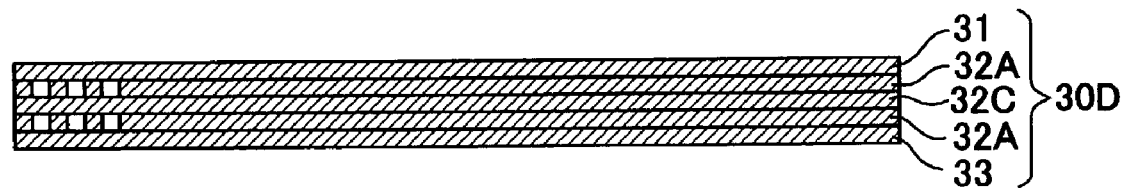
FIG. 8B is a sectional view taken in the direction of the arrows substantially along the line H–H' of FIG. 7.

Also in embodiment 2, similarly to the cooling device 30A shown in embodiment 1, the multiple plate-like members 32A and plate-like members 32C can be laminated alternately for the construction, as shown in FIG. 7. FIG. 7 includes a construction having two plate-like members 32A and one plate-like member 32C. The sectional shape of the path in this case is one shown in FIG. 8A showing a sectional view taken in the direction of the arrows substantially along the line G–G' when plate-like members in FIG. 7 are laminated and in FIG. 8B showing a sectional view taken in the direction of the arrows substantially along the line H–H'.

When the cooling device 30D has the construction, the surface area of the path touching the cooling fluid becomes larger than that of the cooling device 30C shown in FIG. 5. Thus, the cooling efficiency can be increased more. Notably, the construction is an example of the cooling device 30D, which is constructed by laminating the multiple plate-shape members 32A and 32C. More members can be additionally laminated for constructing the cooling device 30D.

Embodiment 3

FIGS. 9A to 9D is an exploded view showing the construction of a semiconductor laser light source device including a cooling device 30E according to embodiment 3 of the present invention. In FIG. 9, the same reference numerals as those in FIG. 1 are given to the same or like members as the cooling device according to embodiment 1, and the detail description will be omitted here.

In embodiment 3, the same members as those shown in embodiment 1 are used as the plate-like member 31, to which the semiconductor laser array 34 is connected, and the plate-like member 33, in which openings for the cooling fluid outlet and inlet are formed.

Figure 9A:
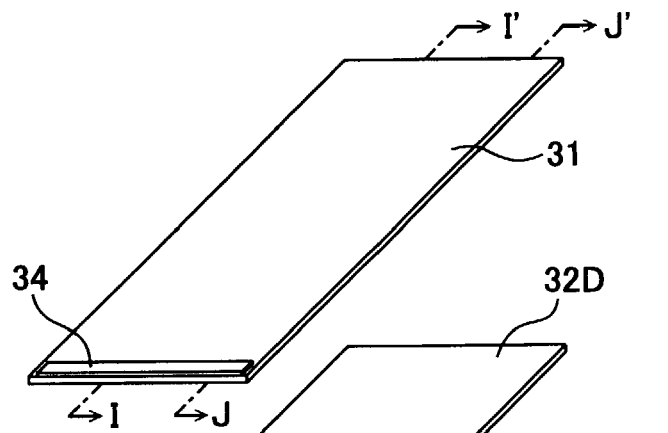
FIG. 9 is an exploded view showing the construction of a cooling device according to embodiment 3 of the present invention.
Figure 9B:
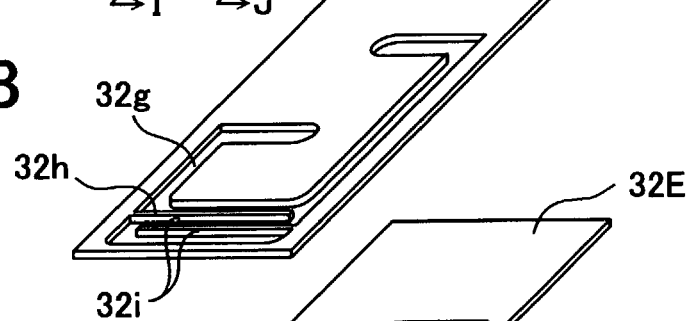

In FIG. 9B, a channel 32g, which functions as a path for introducing or draining cooling fluid, is formed near surfaces of both sides of the plate-like member 32D. The plate-like member 32D includes a cooling channel 32h, which is formed continuously with the channel 32g in the longitudinal direction of the semiconductor laser array 34 near a position immediately under the semiconductor laser array 34, which is joined on the plate-like member 31.

The cooling channel 32h has one end connecting with the plate-like member 32D and the other end separating from the plate-like member 32D and branching off to multiple channels by multiple dividers 32i, which are formed in a comblike manner.

Further, the connecting portions between the multiple comblike dividers 32i and the plate-like member 32D are provided alternately at the both sides of the plate-like member 32D.

Figure 9C:
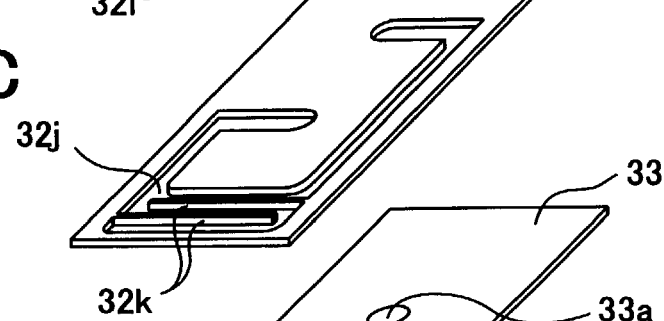
Figure 9D:
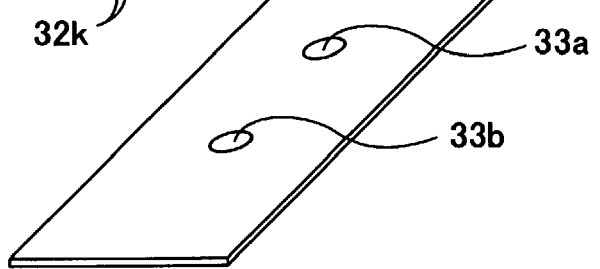

A cooling channel 32j similar to the plate-like member 32D is formed in the plate-like member 32E shown in FIG. 9C. A path near a position immediately under the semiconductor laser array 34 is branching off from a branch 32k to multiple paths.

However, the plate-like member 32D and the plate-like member 32E are laminated in a symmetrical pattern with respect to the center axis such that the position of the connecting portion between the branch 32k and the plate-like member 32E does not match with the position of the connecting portion between the branch 32i and the plate-like member 32D.

Figure 10A:
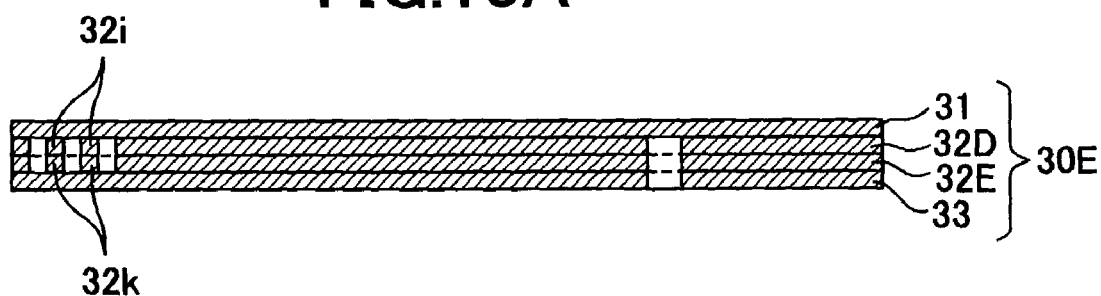
Figure 10B:
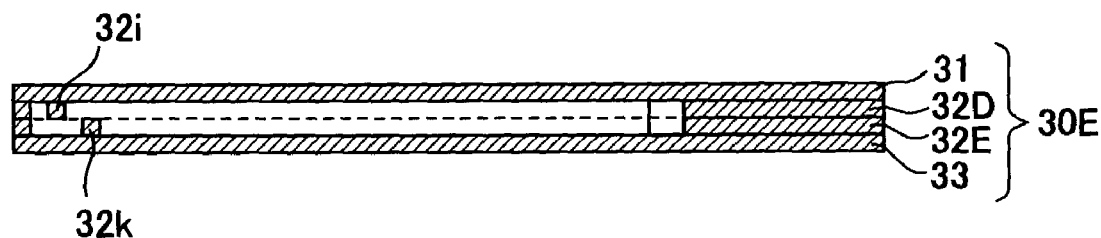
FIG. 10B is a sectional view taken in the direction of the arrows substantially along the line J–J' of FIG. 9.

FIG. 10A is a sectional view taken along the center axis of the cooling device 30E, that is, a sectional view taken in the direction of the arrows substantially along the line I–I' when plate-like members in FIG. 9 are laminated. FIG. 10B is a sectional view taken along the channel 32g, which functions as a cooling fluid flowing path of the cooling device 30E, that is, a sectional view taken in the direction of the arrows substantially along the line J–J' when plate-like members in FIG. 9 are laminated. As shown in FIG. 10A, the path in the vicinity of the center axis where the path is formed along the longitudinal direction of the semiconductor laser array 34 is branched off to multiple paths by the dividers 32i formed in the plate-like member 32D and the dividers 32k formed in the plate-like member 32E.

Further, the dividers 32i and 32k are mechanically and thermally connected with the plate-like member 31 and the plate-like member 33 and construct a cooling fin along the direction of the flow of the cooling fluid.

Further, the section of the cooling fluid flowing path located near a position immediately under the semiconductor laser array 34 is arranged such that the connection portion between the dividers and the plate-like members can exist in the plate-like members 32D and 32E alternately, as shown in FIG. 10B.

The variety of same effects as those described with reference to the device 30A according to embodiment 1 can be obtained from the cooling device 30E according to embodiment 3, which is constructed as above.

Furthermore, the path having a larger path section can be constructed by using the same number of plate-like members as those of the cooling device 30A shown in embodiment 1. Therefore, an amount of the flowing cooling fluid inside of the cooling device 30E is increased, and the area of the path contacting with the cooling fluid is increased. Thus, the cooling efficiency can be improved more.

Figure 11:
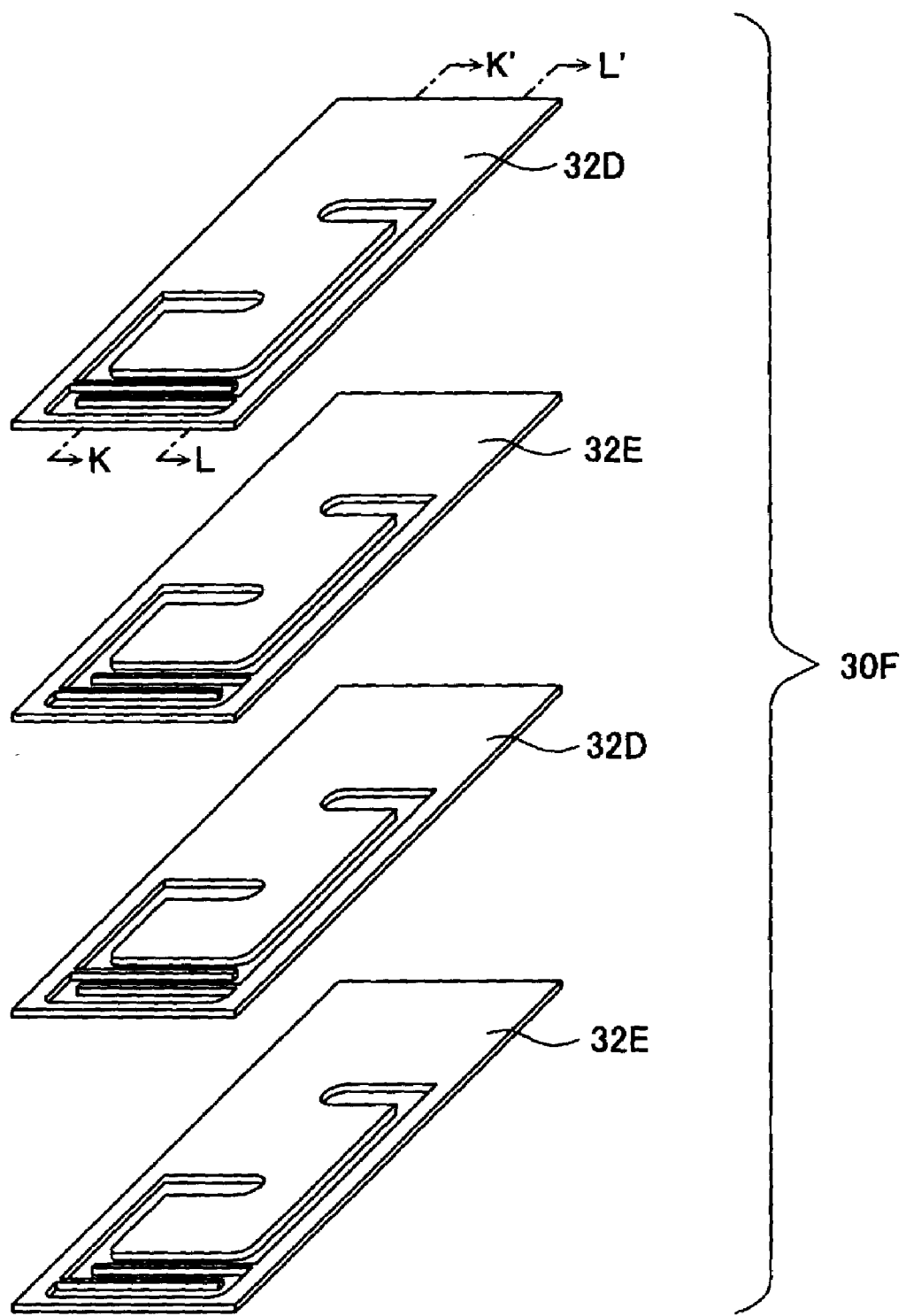
FIG. 11 is an exploded view showing the construction of another cooling device according to embodiment 3 of the present invention.

The cooling device 30E described in embodiment 3 is constructed by laminating one plate-like member 32D and one plate-like member 32E, in which channels functioning as cooling paths are formed. As shown in FIG. 11, a cooling device 30F can be constructed by laminating multiple plate-like members 32D and the plate-like members 32E alternately one by one.

The number of plate-like members 32D and 32E, multiple of which are laminated alternately each by each, may be the same as the number shown in FIG. 11. Alternatively, the number of the plate-like members 32E may be smaller by one.

Figure 12A:
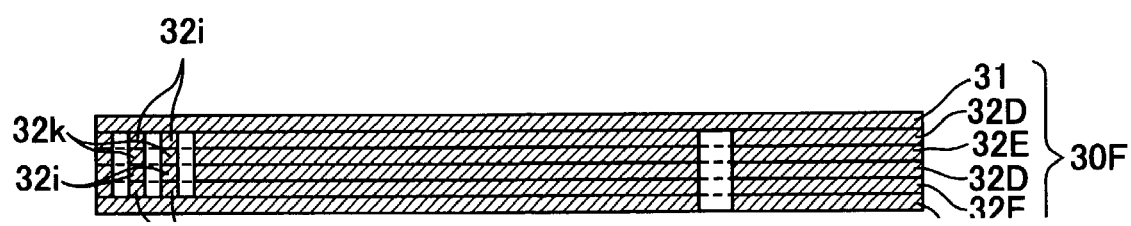
Figure 12B:
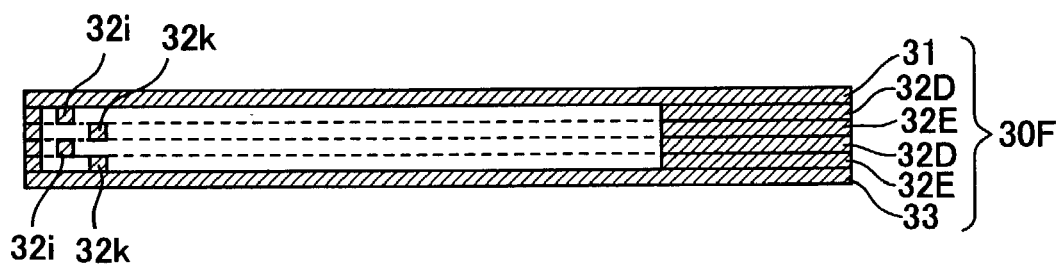
FIG. 12B is a sectional view taken in the direction of the arrows substantially along the line L–L' of FIG. 11.

FIG. 12A is a sectional view taken along the center axis of the cooling device 30F when two plate-like members 32D and two plate-like members 32E are laminated in the cooling device described in embodiment 3. In other words, FIG. 12A is a sectional view taken in the direction of the arrows substantially along the line K–K' when plate like members in FIG. 11 are laminated. FIG. 12B is a sectional view along the channel 32g functioning as the cooling fluid flowing path in the cooling device 30F, that is, a sectional view taken in the direction of the arrows substantially along the line L–L' when plate-like members in FIG. 11 are laminated.

Like the case shown in FIG. 10, the path in the vicinity of the center axis where the path is formed along the longitudinal direction of the semiconductor laser array 34 is branched off to multiple paths by the dividers 32i formed in the plate-like member 32D and the dividers 32k formed in the plate-like member 32E.

Further, the dividers 32i and 32k are mechanically and thermally connected with the plate-like member 31 and the plate-like member 33 and construct a cooling fin along the direction of the flow of the cooling fluid.

Further, the section of the cooling fluid flowing path located near a position immediately under the semiconductor laser array 34 is arranged such that the connection portion between the dividers 32i and the plate-like members 32D and 32E can exist alternately in the vertical and horizontal directions in the plate-like members 32D and 32E, as shown in FIG. 12B.

Furthermore, the path having a larger path section can be constructed by using the construction. Therefore, an amount of the flowing cooling fluid inside of the cooling device 30E can be increased, and the area of the path contacting with the cooling fluid is increased. Thus, the higher cooling efficiency can be maintained even when the amount of heat generated by the semiconductor laser array 34 increases.

Figure 13:
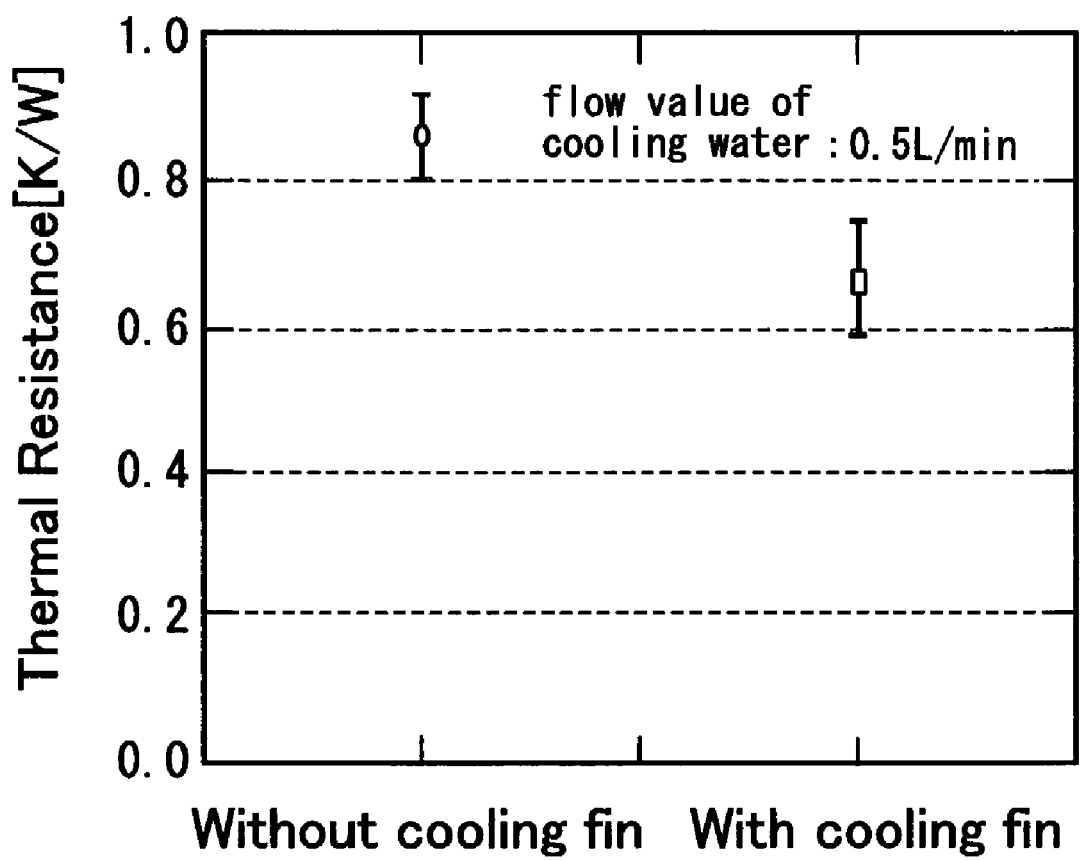
FIG. 13 is a graph showing changes in thermal resistance depending on the presence of a cooling fin in the cooling device according to embodiment 3 of the present invention.

A comparison experiment was performed in order to verify the effect of the cooling fin arranged by the dividers 32i and 32k in the cooling device 30E shown in FIG. 9. FIG. 13 shows the result of the experiment. An amount of cooling water flowing through a cooling path was 0.5 liter/minute.

As being apparent from FIG. 13, while the thermal resistance was the average of 0.86 K/W in the construction without the cooling fin, it was reduced to the average of 0.67 K/W in the cooling device 30E having the cooling fin. Accordingly, the effect of the cooling device 30E according to the present invention could be verified.

Embodiment 4

Figure 14:
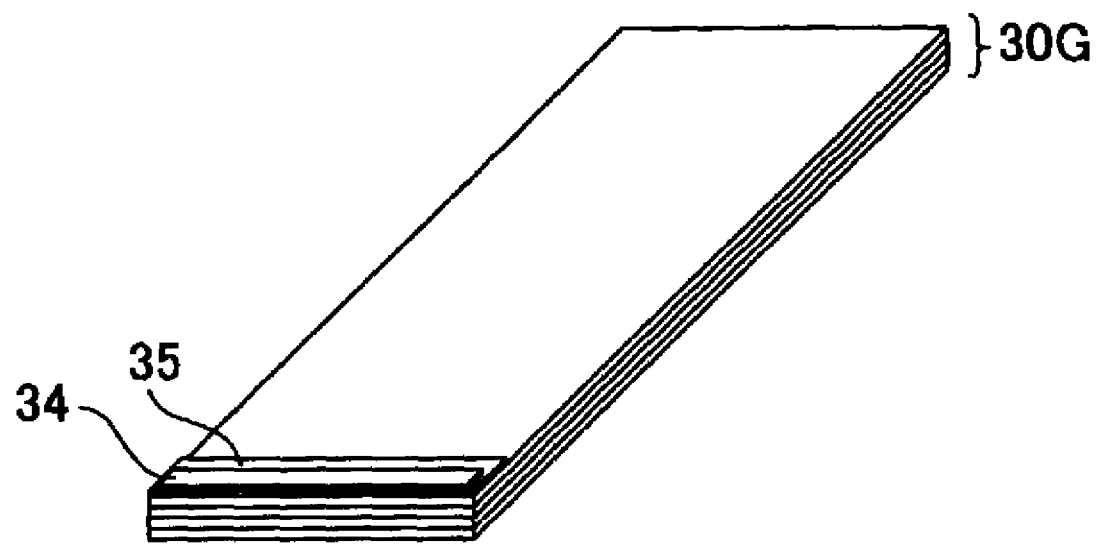
FIG. 14 is an external view showing the construction of another cooling device according to embodiment 4 of the present invention.

FIG. 14 is an external view showing the construction of a semiconductor laser light source device including a cooling device 30G according to embodiment 4 of the present invention. In FIG. 14, the same reference numerals are given to the same or like members as the cooling device according to embodiments 1 to 3, and the detail description will be omitted here.

According to embodiment 4, in the cooling device shown in embodiments 1 to 3, the semiconductor laser array 34, which is the cooled body, and the plate-like member 31 constructing the cooling device 30G are thermally and mechanically joined through a submount 35. The submount 35 is formed by a material having a mean value between a linear thermal expansion coefficient of a component (mainly gallium arsenide: GaAs) of the semiconductor laser array 34 and a linear thermal expansion coefficient of a component (typically Cu) of the plate-like member 31.

In other words, the submount material is selected so as to satisfy, among the respective linear thermal expansion coefficients of the plate-like member 31, the submount material, and the constructing material of the semiconductor laser array, the following relationship:

plate-like member 31>the submount material>the constructing material of the semiconductor laser array (1)

When the material of the semiconductor laser array 34 is gallium arsenide (GaAs), which is the most common, the material of the submount 35 is preferably an alloy of copper (Cu), such as copper tungsten (CuW) and copper molybdenum (CuMo), and metal having a high melting point, which satisfies the relationship in the inequality (1).

By using the construction, the thermal resistance of the cooling device 30G with respect to the semiconductor laser array 34 tends to increase by comparison with the case that the semiconductor laser array 34 is connected with the plate-like member 31 not through the submount 35 but directly. However, forming the submount 35 extremely thin, specifically the order of 100 to 300 $\mu$m thin, can keep the increase of the thermal resistance very small.

When the semiconductor laser array 34 is connected with the plate-like member 31 not through the submount 35 but directly, mechanical distortion occurs in the semiconductor laser array 34 due to the difference in linear thermal expansion coefficient among materials constructing both of them during lasing. Then, the risk of destroying the semiconductor laser array 34 is increased.

In embodiment 4, the semiconductor laser array 34 is thermally and mechanically connected with the cooling device 30G through the submount 35 so that the difference in linear thermal expansion coefficient among those and the plate-like member 31 can be reduced. Then, the distortion occurred in the semiconductor laser array 34 can be controlled, which allows stable operations over a long period of time.

Embodiment 5

In the cooling device shown in embodiments 1 to 3, the plate-like members constructing the laminate are the metal material having good thermal conductivity, such as Cu typically, and is constructed by using the same material totally.

On the other hand, in the cooling device according to embodiment 5, the plate-like member 31 with which the semiconductor laser array 34 is joined is constructed by using a material having a value approximate to the linear thermal expansion coefficient of the material constructing the semiconductor laser array, such as CuW and CuMo specifically, in the cooling device according to embodiments 1 to 3.

The material such as CuW and CuMo has smaller thermal conductivity than that of Cu. Therefore, when these materials are used for the plate-like member 31, the heat exchange performance of the plate-like member 31 is worse than those of the cooling devices according to embodiments 1 to 3, which are made of Cu. Therefore, the cooling performance of the cooling device by itself is reduced.

However, in embodiment 5, the semiconductor laser array 34 is directly joined with the plate-like member 31 in the thermal and mechanical manner. Thus, the submount 35 described in embodiment 4 and the thermal resistance by the joining layer, which is caused when the submount 35 is joined, do not exist. Therefore, the effect of the increase in thermal resistance due to the decrease in the thermal conductivity of the panel-like member 31 is offset. Rather, the thermal resistance of the cooling device with respect to the semiconductor laser array 34 can be reduced.

In other words, with the cooling device described in embodiment 5, the same effects as those of the cooling devices described in embodiments 1 to 3 can be obtained. Further, there is an effect that the thermal resistance of the cooling device can be reduced.

The panel-like member 31 is constructed by using a material having a linear thermal expansion coefficient appropriate to that of the material constructing the semiconductor laser array. Therefore, even when the semiconductor laser array 34 is joined with the panel-like member 31 directly, the distortion occurred in the semiconductor laser array 34 due to the difference in linear thermal expansion coefficient can be suppressed. Like the cooling device according to embodiment 4, the stable lasing can be achieved over a long period of time.

Embodiment 6

Figure 15A:
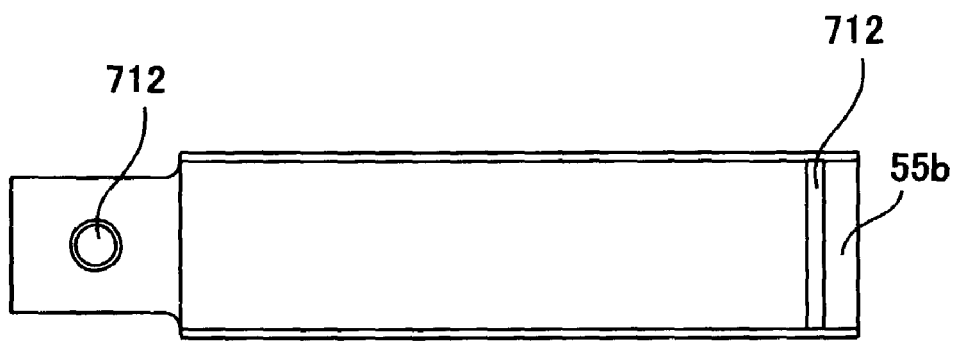
FIGS. 15A to 15C are external views of a semiconductor laser light source device according to embodiment 6 of the present invention, and, more specifically.
Figure 15B:
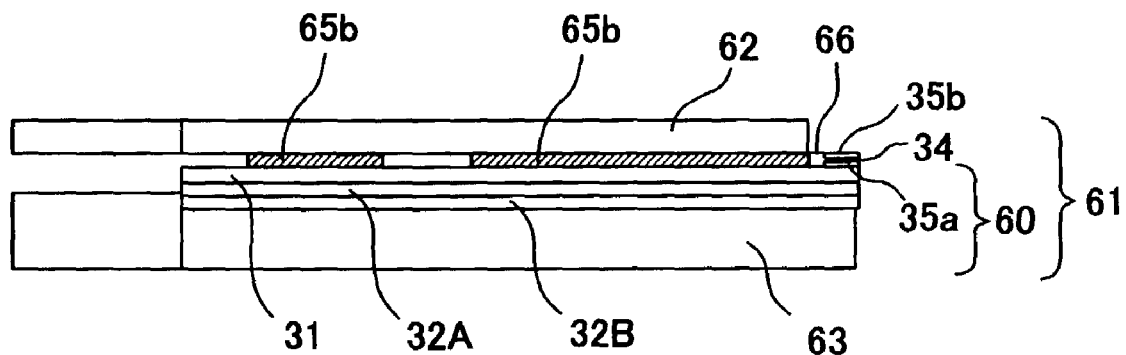
Figure 15C:
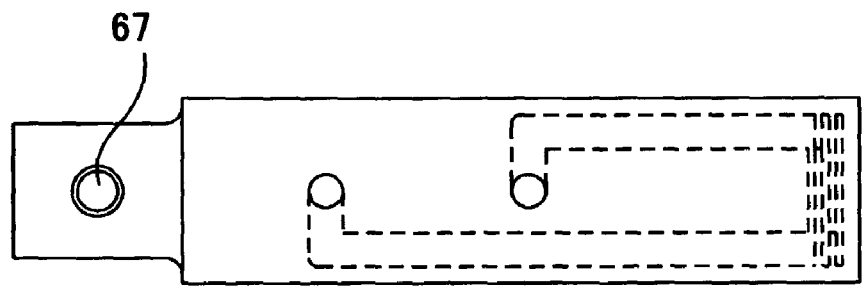

FIG. 15 is a diagram showing the construction of a semiconductor laser light source device 61 including a cooling device 60 according to embodiment 6 of the present invention. FIG. 15A is a top view of the laser light source device. FIG. 15B is an elevation view, and FIG. 15C is a bottom surface view. In FIG. 15, the same reference numerals are given to the same or like members as those in proceeding embodiments, and the detail description will be omitted here.

In FIG. 15, 31, 32A and 32B refer to panel-like members constructing a laminate, and they are the same as the members described in the proceeding embodiments. In FIG. 15, 63 refers to a panel-like member including a feeding terminal 67 instead of the lamella member 33 of the cooling device described in the proceeding embodiments. The cooling device 60 according to embodiment 6 is constructed by laminating these panel-like members 31, 32A and 32B.

Furthermore, 62 refers to an upper electrode, which is constructed by using metal with good conductivity and has a form similar to that of the cooling device 60. The semiconductor laser array 34 is joined onto the plate-like member 31 of the cooling device 60 through a submount 35a, which is formed of a material satisfying the relationship expressed the inequality (1), more specifically CuW, CuMo or the like, by using high melting point solder, such as AuSn alloy solder.

A submount 35b, which is formed of the same material as that of the submount 35a is joined at the top surface of the semiconductor laser array 34 also by using AuSn solder. A metal lamella (or metal foil) 66 constructed by using Au, Cu or the like is joined thereon through the submount 35b.

In FIG. 15C, a case is shown where a semiconductor laser light source device is constructed by using a cooling device, which is constructed by laminating one panel-like member 32A and one panel-like member 32B in which the cooling fluid flowing paths shown in embodiment 3 are formed. However, the semiconductor laser light source device may be constructed by using any of cooling devices described above.

Members 65a and 65b sandwiched by the cooling device 60 and the upper electrode 62 are insulating plates constructed by using an insulating material. The members 65a and 65b function to connect the cooling device 60 and the upper electrode 62 mechanically for the integral construction, and to electrically insulate between the cooling device 60 and the upper electrode 62.

Therefore, current supplied by a driving power supply flows from the cooling device 60 to the upper electrode 62 via the semiconductor laser array 34 and returns to the driving power supply. Thus, the semiconductor laser array 34 lases. Notably, it is needless to say that the current path becomes opposite to the above when the polarity is reversed.

In the semiconductor laser light source device 61 described in embodiment 6, like the semiconductor laser light source device described in embodiments 1 to 3, the laminate constructing the cooling device 60 is constructed by using only metal having good conductivity, such as Cu. The submount 35a, the metal lamella 66 and the upper electrode, which are a path of current supplied by the power supply, are constructed by using metal having good conductivity. These members are connected by using a measure such as solder joining. Therefore, an electrical contact with low resistance and high reliability can be obtained.

Therefore, the semiconductor laser light source device having small electrical resistance can be achieved. Thus, the unnecessary generation of Joule's heat during operation can be suppressed. Furthermore, the laminate in which the cooling fluid flowing path is formed is constructed integrally by using a method such as liquid diffusion joining. Thus, the problem of the leak of cooling fluid can be avoided over a long period of time.

Furthermore, since the plate-like members constructing the laminate has good thermal conductivity and the small thermal resistance within the cooling device 60, any significantly fine path is not necessary to form. The channel to be used as the cooling fluid flowing path can be formed by using an inexpensive measure such as the chemical etching. There is higher flexibility in the path design. In this way, since the channel having the larger section than that of the micro-channel can be formed, the water quality control such as dust removal can be performed easily.

Furthermore, the cooling fluid flowing path is formed such that the flow of the cooling fluid, as shown by a portion indicated by broken lines in FIG. 15C can match with the longitudinal direction of the semiconductor laser array 34. Therefore, uneven cooling does not occur which is due to the unbalanced flowing amount of the cooling fluid caused by the variation in dimensions of the path section.

Even when a part of the path is blocked with dust, extremely uneven cooling does not occur since the cooling fluid flows along the longitudinal direction of the semiconductor laser array 34.

Accordingly, the variation in output wavelength of laser light emitted from each semiconductor laser in the semiconductor laser array 34 is suppressed. Therefore, the semiconductor laser light source device, which allows the laser light output having the sharp spectrum can be achieved.

Embodiment 7

While, in FIG. 15, the semiconductor laser array 34 is joined to the plate-like member 31 through the submount 35*a*, a cooling device may be used in which the semiconductor laser array 34 is directly connected with the plate-like member in the thermal and mechanical manner, as described in embodiment 5.

In this case, the thermal resistance can be reduced more than that in the cooling device used for the semiconductor laser light source device 61, which is described in embodiment 6.

Furthermore, the panel-like member 31 is constructed by using a material having a linear expansion coefficient value approximate to that of the material constructing the semiconductor laser array 34. Therefore, the lack and the dislocation of crystal due to the distortion caused in the material constructing the semiconductor laser because of the difference in linear thermal expansion coefficient can be suppressed. As a result, more stable outputs of laser light can be achieved over a long period of time.

Embodiment 8

Figure 16:
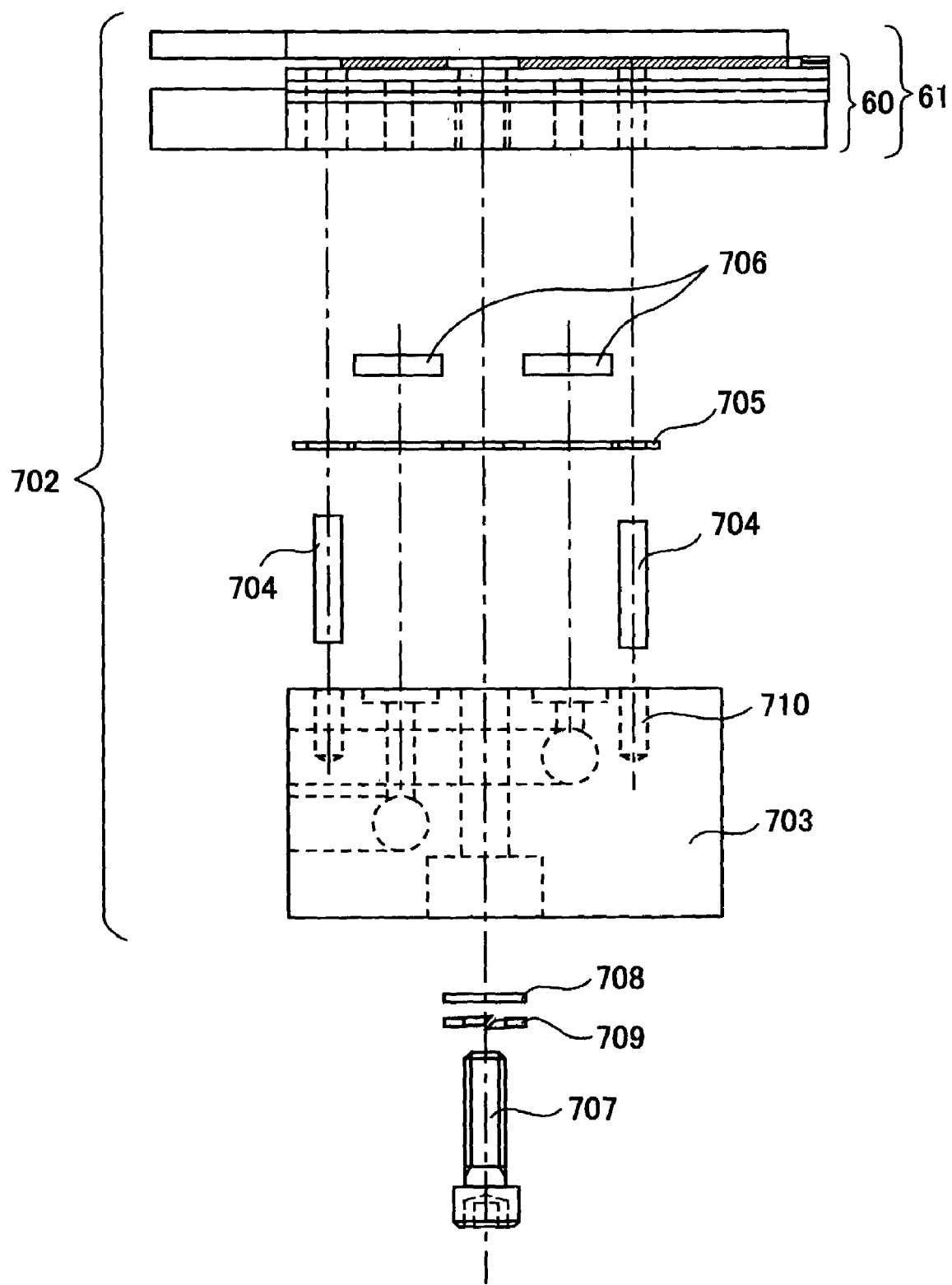
FIG. 16 is an exploded diagram viewing from the side, which shows the construction of a semiconductor laser light source unit according to embodiment 8 of the present invention.

FIG. 16 is an exploded view showing the construction of a semiconductor laser light source device 702 including the cooling device 60 according to embodiment 7 of the present invention. The same reference numerals are given to the same or like members as the members described above, and the detail description will be omitted here.

In FIG. 16, 61 refers to a semiconductor laser light source device constructed by the cooling device 60, the semiconductor laser array 34, the upper electrode 62 and so on. 703 refers to a cooling fluid manifold for supplying and collecting cooling fluid to/from the semiconductor laser light source device 61, and a cooling fluid flowing path is formed inside.

The cooling fluid manifold 703 supplies and collects the cooling fluid to/from the semiconductor laser light source device 61 and also functions as a pedestal, which fixes the semiconductor laser light source device 61 by using a fastening member such as a screw or a bolt, referred by 707. The semiconductor laser light source device 61 is positioned in a highly accurate manner by using two pins 704 and is fixed to the cooling fluid manifold 703 in order to prevent the displacement. 706 refers to a seal member such as an "O" ring, which maintains the watertightness of the cooling fluid flowing path.

When the cooling fluid manifold 703 is constructed by using a conductive material such as metal and when the semiconductor laser light source device 61 and the cooling fluid manifold 703 must be electrically insulated, they are fixed through an insulating sheet 705 formed by an insulating material such as polyimide.

Also, the positioning pins 704 and the bolt 707 contacting both of the semiconductor laser light source device 61 and the cooling fluid manifold 703 need the insulation. Therefore, the positioning pins 704 may be formed by ceramics, resin, or the like. The bolt 707 may be insulated by forming it by resin such as polycarbonate or by sandwiching an insulating washer 708 when it is formed by metal.

If the cooling fluid manifold 703 and the semiconductor laser light source device 61 do not need to be electrically insulated in particular, the insulating sheet 705 and the insulating washer 708 are not necessary, which can reduce the number of parts. Furthermore, the positioning pins 704 and the bolt 707 may be formed by a conductive material.

Figure 17A:
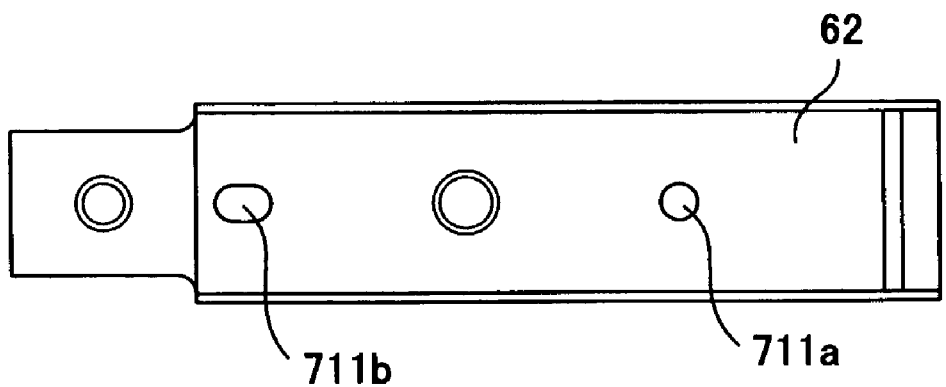
FIGS. 17A to 17C are external views of a semiconductor laser light source device constructing a semiconductor laser light source unit according to the embodiment 8 of the present invention, and, more specifically.
Figure 17B:
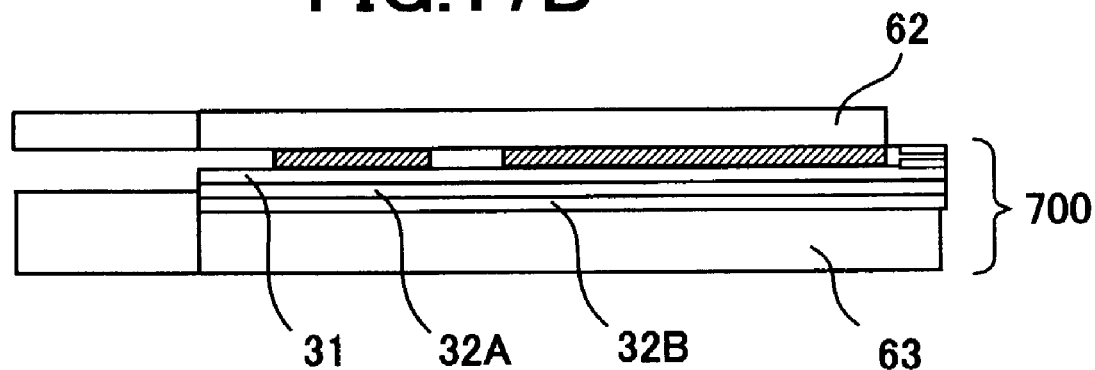
Figure 17C:
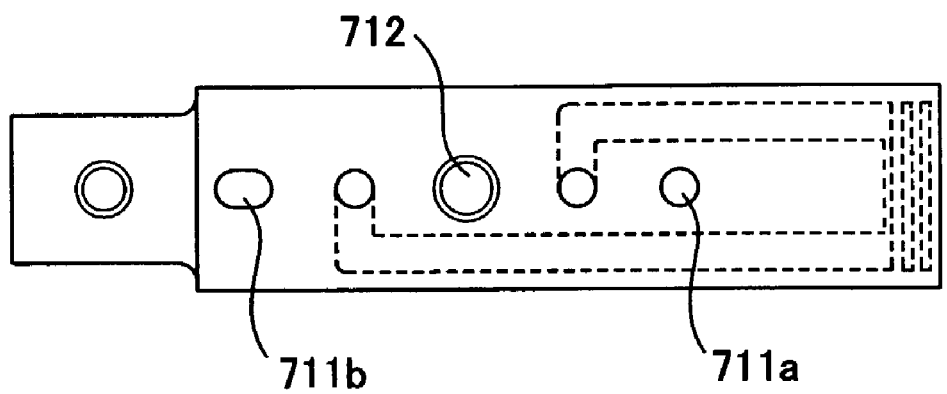

In embodiment 8, the positioning pins 704 pass through the cooling device 60, as shown in FIG. 17, pin-holes 711*a* and 711*b* are provided in the laminate having the plate-like members 31, 32A, 32B and 63. Furthermore, a screw-hole 712 for the fixing bolt 707 is provided.

These pin-holes and screw-hole may be formed by mechanical processing after the laminate having the plate-like members 31, 32A, 32B and 63 is formed, or may be formed at the same time when each of the plate-like members is formed before the laminate is formed.

In the latter case, the pin-holes may be formed in all of the plate-like members 31, 32A, 32B and 63 so that the pin-holes 711*a* and 711*b* can be used as positioning holes for the plate-like members when constructing the laminate. Thus, the laminate can be formed easily without any needs for special tools.

Figure 18B:
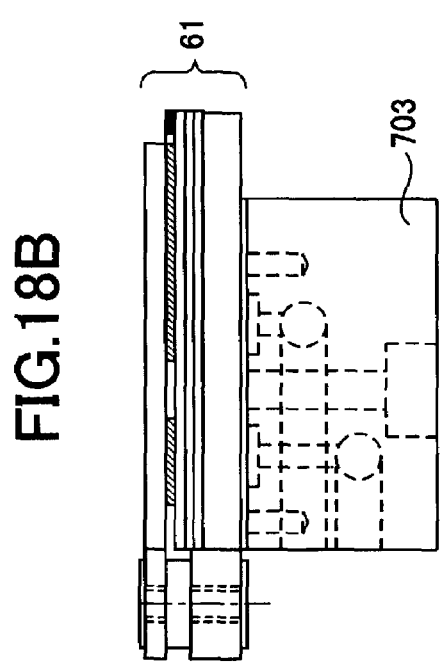
FIGS. 18A to 18C are external views of the construction of the semiconductor laser light source device according to embodiment 8 of the present invention, and, more specifically.
Figure 18C:
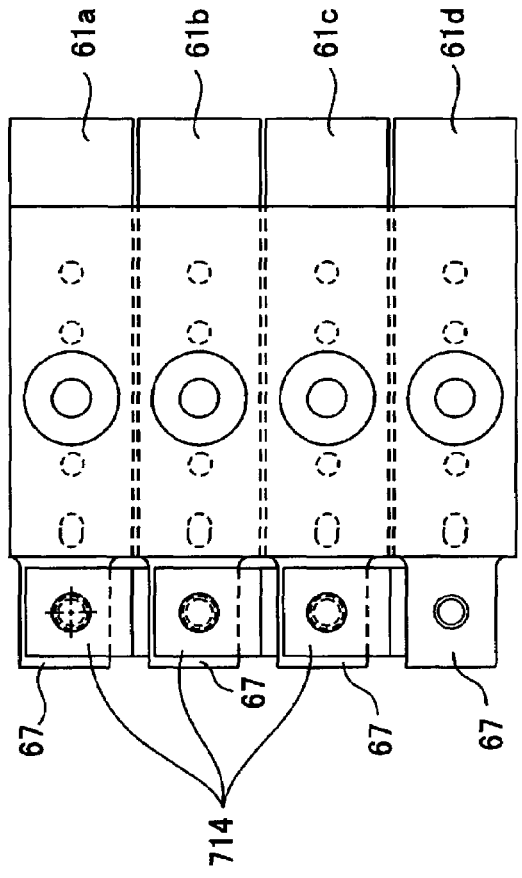
Figure 18A:
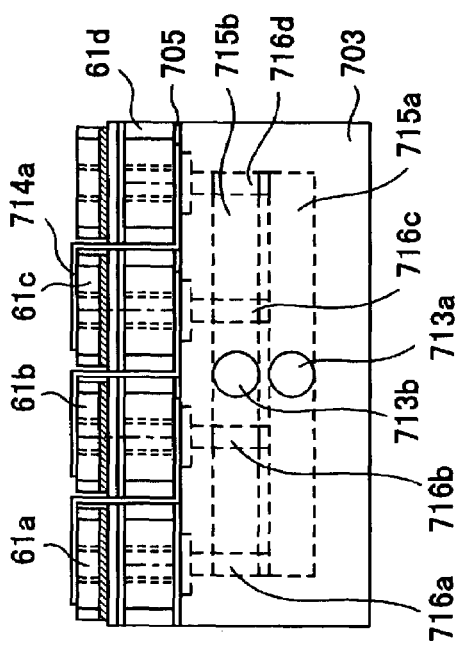

FIG. 16 illustrates a method of fixing one semiconductor laser light source device 61 to the cooling fluid manifold 703. The semiconductor laser light source unit 702 according to embodiment 8 is constructed as a high output laser light source device in which multiple semiconductor laser light source devices 61 are aligned and fixed in the perpendicular direction of FIG. 16, as shown in the assembly diagram in FIG. 18A. FIG. 18 illustrates an example of the construction of the semiconductor laser light source unit, in which four of the semiconductor laser light source devices 61 are aligned and fixed.

As shown in FIG. 18, all of the semiconductor laser light source devices 61*a* to 61*d* are fixed on the cooling fluid manifold 703 by using the above-described fixing method. The semiconductor laser light source devices 61*a* to 61*d* adjacent to each other are positioned by using the positioning pins 704 and fixed in certain intervals in order to prevent them from touching with each other.

Wires from the driving power supply, which is not shown, are connected to a feeding terminal on the side of the cooling device of the semiconductor laser light source device 61*a* positioned at one end of the semiconductor laser light source unit 702 and to a feeding terminal on the side of the upper electrode of the semiconductor laser light source device 61*d* positioned at the other end. The adjacent semiconductor laser light source devices are cross-linked from the upper electrode of the semiconductor laser light source device 61*a* to the feeding terminal on the cooling device of the semiconductor laser light source device 61*b* by a load-dispatching board 714. Then, the adjacent semiconductor laser light source devices are electrically connected by a coupling part such as a screw, which is not shown.

Figure 19:
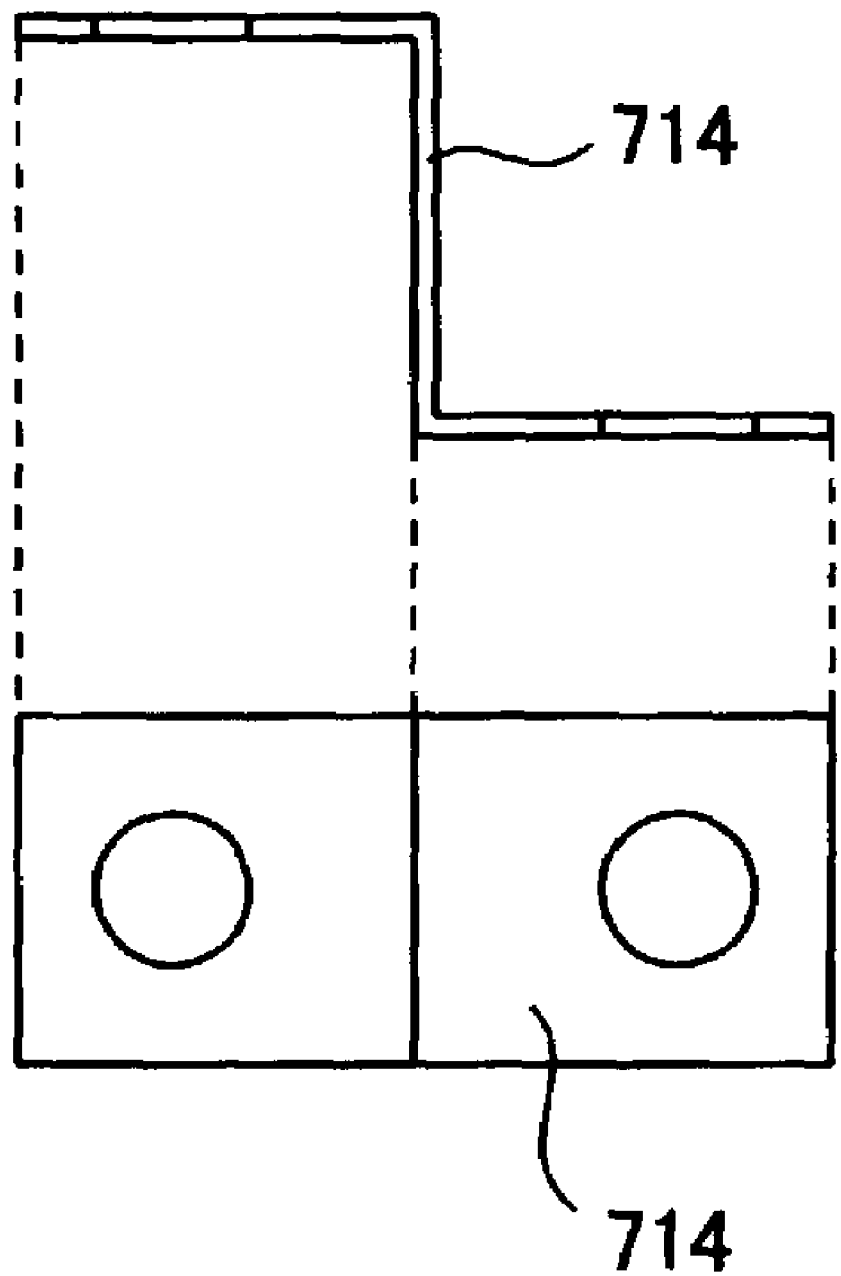
FIG. 19 is an external view of a load-dispatching board, which is used for the semiconductor laser light source unit according to embodiment 8 of the present invention.

FIG. 19 shows the schematic construction of the load-dispatching board 714. Here, FIG. 19A is a sectional view of the load-dispatching board 714 while 19B shows the top view. Similarly, the semiconductor laser light source devices 61*b*, 61*c* and 61*d* are sequentially cross-linked through the load-dispatching board 714.

Accordingly, when current from the driving power supply is supplied to the feeding terminal on the side of the cooling device of the semiconductor laser light source device 61*a*, the current flows from the semiconductor laser light source device 61a to the semiconductor laser light source device 61d sequentially in series. Thus, laser light is emitted from each of the semiconductor laser light source devices 61a to 61d.

Next, the flow of cooling fluid will be described based on FIG. 18. The cooling fluid introduced to an inlet 713a of the cooling fluid manifold 703 by a cooling device such as chiller, not shown, is distributed uniformly to branch paths 716a to 716d via a main path 715a. Then, the cooling fluid flows into respective the semiconductor laser light source device 61a to 61d.

The distributed cooling fluid flows through the cooling fluid path within the semiconductor laser light source device, and then flows from respective branch paths 717a to 717d to an outlet 713b through a main path 715b, returning to the cooling device.

In the semiconductor laser light source unit 703 according to embodiment 8 constructed as above, when multiple semiconductor laser light source devices including cooling devices are aligned to form the laser light source unit, a member for aligning and fixing the semiconductor laser light source device also functions as a cooling manifold, which distributes and collects cooling fluid to/from the aligned semiconductor laser light source devices 61a to 61d. Therefore, a thin and compact semiconductor laser light source unit can be constructed.

Furthermore, the semiconductor laser light source device including the cooling device is formed in integral structure by laminating multiple plate-like members and has enough mechanical strength. Therefore, each of the semiconductor laser light source devices 61a to 61d can be strongly fastened by fastening a screw, a bolt or a nut in order to fix it to the cooling fluid manifold 703. Thus, there is no risk of the leak of cooling fluid at the connection portion of the cooling fluid manifold 703 and the semiconductor laser light source devices 61a to 61d.

The path which is formed for distributing and collecting cooling fluid to/from respective semiconductor laser light source devices 61a to 61d within the cooling fluid manifold 703 has a large sectional dimension. Thus, there is no risk of causing an unbalanced flowing amount of the cooling fluid to be distributed to the semiconductor laser light source devices 61a to 61d due to dust blocking or the like. Therefore, the cooling fluid is distributed uniformly to the aligned semiconductor laser light source devices 61a to 61d. As a result, the semiconductor laser light source unit can be achieved, which allows laser light outputs having sharp spectra with small variations in the output wavelength.

Embodiment 9

In embodiment 8, the semiconductor laser light source unit is constructed by using the cooling fluid manifold in which paths are formed for distributing cooling fluid to semiconductor laser light source devices in parallel. On the other hand, in embodiment 9, the semiconductor laser light source unit is constructed by using a cooling fluid manifold 803 in which paths shown in FIG. 20 are formed. As a result, the cooling fluid paths can be formed in series.

Since it is difficult to form the cooling fluid manifold having paths shown in FIG. 20 from an integral object, two members 803a and 803b divided along the line M–M' in the figure may be formed, for example. After that, the cooling fluid manifold may be formed by joining both of them by using a measure such as brazing. In the cooling fluid manifold 803 having paths shown in FIG. 20, the directions of the flows of cooling fluid within the semiconductor laser light source device differ between adjacent semiconductor laser light source devices.

However, any of cooling paths formed in the cooling devices can perform uniform cooling independently from the direction of the flow of the cooling fluid. Therefore, the same effect can be obtained as that of the semiconductor laser light source unit in embodiment 7.

Furthermore, since cooling fluid flows the semiconductor laser light source devices in series, no variations in the amount of the flow occur among the semiconductor laser light source devices. As a result, the semiconductor laser light source unit can be achieved, which allows laser light outputs having sharp spectra with extremely small variations in the output wavelength.

Embodiment 10

In the semiconductor laser light source units shown in embodiments 8 and 9, the semiconductor laser light source devices aligned and fixed to the cooling manifold are electrically connected in series.

Figure 22:
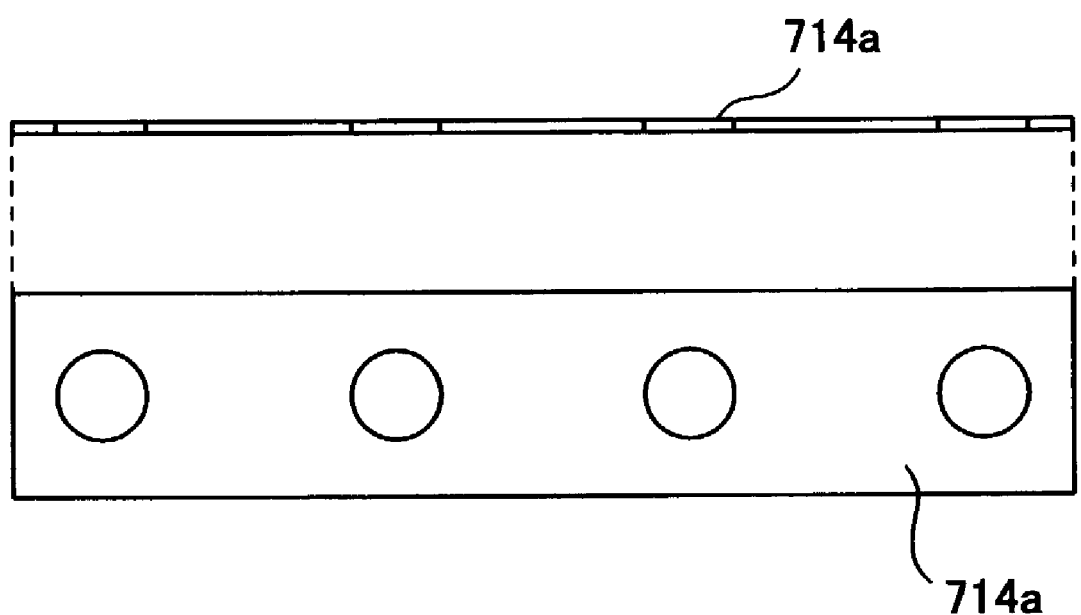
FIG. 22 is an external view of a load-dispatching board, which is used for the semiconductor laser light source unit according to embodiment 10 of the present invention.
Figure 23:
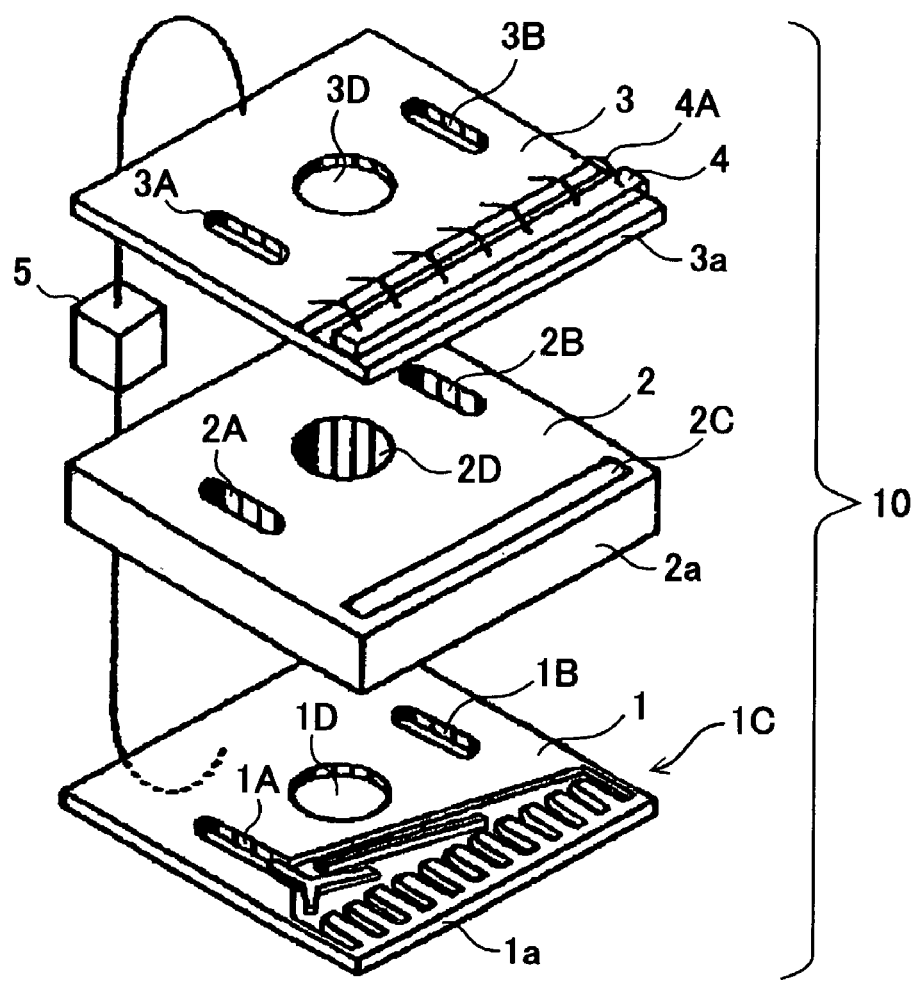
FIG. 23 is an exploded view showing the construction of a cooling device of a semiconductor laser array in the related art.
Figure 24:
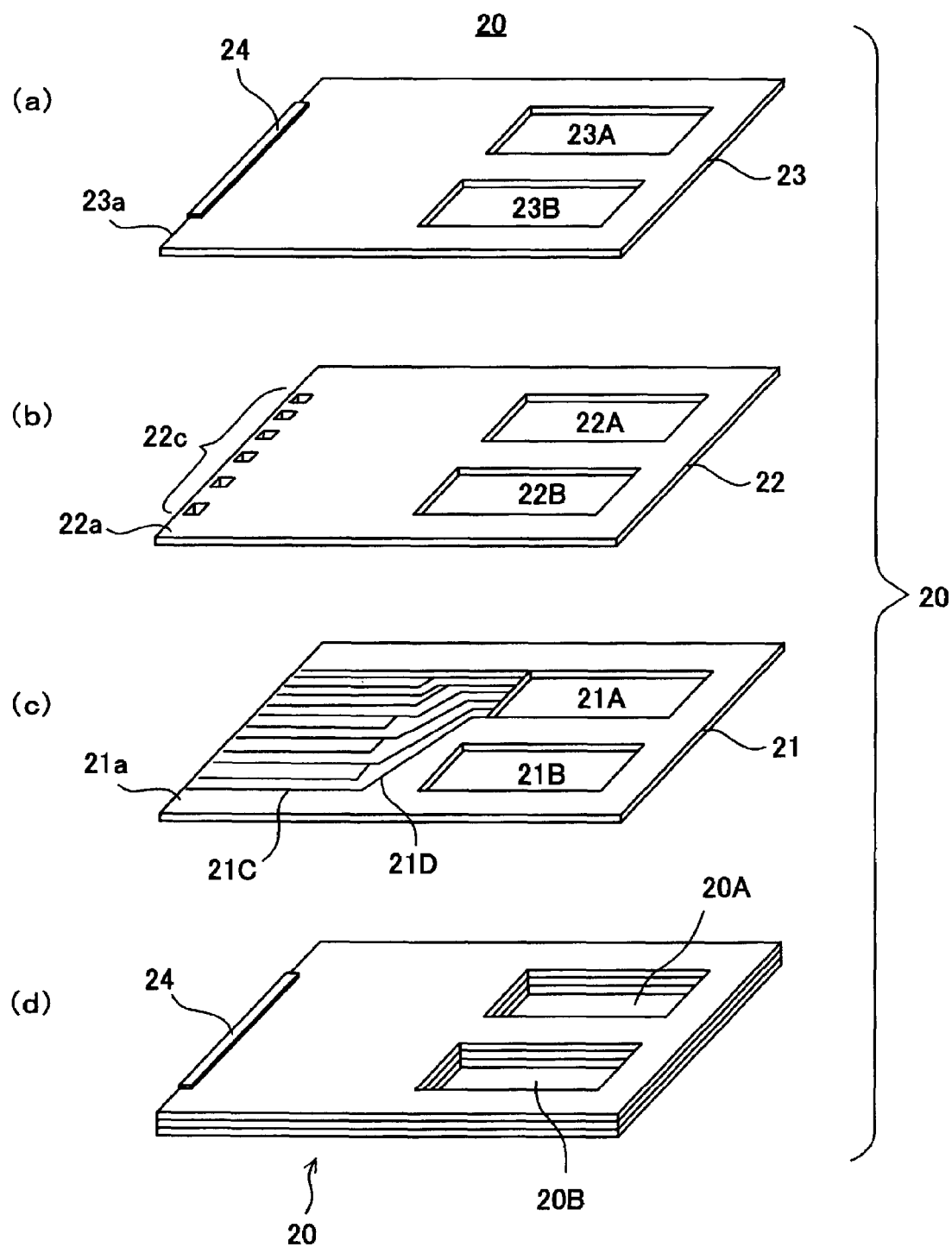
FIG. 24 is an exploded view showing the construction of a cooling device of another semiconductor laser array in the related art.

In a semiconductor laser light source unit according to embodiment 10, a load-dispatching board 714a as shown in FIG. 22 for connecting between feeding terminals on the side of upper electrode and between feeding terminals on the side of the cooling devices, which are formed in the semiconductor laser light source devices 61a to 61d aligned and fixed in the cooling fluid manifold 703, as shown in FIG. 21. Thus, a circuit construction can be achieved in which current from the driving power supply is distributed in parallel. Here, FIG. 22A shows a sectional view of the load-dispatching board 714a while 22B shows the top view.

The cooling fluid path may be a cooling fluid manifold, which distributes cooling fluid to semiconductor laser light source devices in parallel or may be a cooling fluid manifold, which supplies cooling fluid in series.

The laser light source unit is arranged such that current from the driving power supply can be distributed to semiconductor laser devices in parallel. Therefore, no electrical insulation is required between upper electrodes of the adjacent semiconductor laser light source devices and between cooling devices.

Accordingly, adjacent semiconductor laser light source devices do not need to be aligned and fixed in certain intervals for the electrical insulation, unlike the semiconductor laser light source units described in embodiment 8 and embodiment 9. Therefore, a compact semiconductor laser light source unit can be achieved.

Embodiment 11

According to embodiment 11, the cooling fluid manifold in the semiconductor laser light source units shown in embodiments 8 to 10 is formed by an insulating material such as resin.

Only the material of the cooling water fluid manifold is changed in the semiconductor laser light source unit, and the other members are the same as those in the semiconductor laser light source units shown in embodiments 8 to 10. Accordingly, the same effects can be obtained.

Furthermore, forming the cooling fluid manifold by the insulating material eliminates a need for an insulating sheet 705 or the insulating washer 708 even when the semiconductor laser light source device and the cooling fluid manifold need electrical insulation therebetween.

In addition, the positioning pin 704 or the bolt 707 for fixing the semiconductor laser light source device can be constructed by using an inexpensive member made of metal.

As described above, by reducing the fewer parts and also, by using the inexpensive materials, a semiconductor laser light source unit which can be assembled easily at a law cost, can be achieved.

Embodiment 12

A solid state laser device, which can process a processed subject, can be obtained by attaching the semiconductor laser light source unit as a pumping light source at the side of a solid state laser rod. In the solid state laser device, the solid state laser is pumped by laser light emitted from a semiconductor laser array having extremely stable output wavelength. Thus, efficient and stable optical outputs can be obtained.

INDUSTRIAL APPLICABILITY

As described above, the cooling device according to the present invention is useful as a cooling device, which cools semiconductor laser for more stable operations. Furthermore, the semiconductor laser light source device and the semiconductor laser light source unit according to the present invention are useful as a light source, which pumps, for example, solid state laser. In addition, the solid state laser device to which the semiconductor laser light source unit is attached is useful as a light source for processing, for example.

What is claimed is:

1. A cooling device, comprising:
   a first plate-like member made of metal, to which a cooled body is joined along the predetermined end portion;
   a second plate-like member made of metal, in which a cooling fluid introducing channel provided so as to reach an inlet opening portion, which introduces cooling fluid, and one end of an area connected to the inlet opening portion and corresponding to the end portion and a cooling fluid draining channel provided so as to reach an outlet opening portion, which drains cooling fluid, and the other end of the area connected to the outlet opening portion and corresponding to the end portion are formed; and
   a third plate-like member made of metal, which is formed along the area corresponding to the end portion and to which at least one cooling channel is provided through which cooling fluid flows straight in the longitudinal direction of the cooled body by communicating the cooling fluid introducing channel and the cooling fluid draining channel.

2. The cooling device according to claim 1 wherein the second plate-like member and the third plate-like m6nber are laminated alternately a plurality of times.

3. The cooling device according to claim 1 wherein the second plate-like member has a plurality of cooling channels provided in the vertical direction with respect to the longitudinal direction of the cooled body.

4. The cooling device according to claim 3 wherein a length of the plurality of cooling channels of the second plate-like member and a width of the plurality of cooling channels as a whole of the third plate-like member are almost equal.

5. The cooling device according to claim 3 wherein the second plate-like members and the third plate-like members are laminated alternately a plurality of times.

6. A cooling device, comprising:
   a first plate-like member formed by metal, to which a cooled body is joined along the predetermined end portion;
   a second plate-like member formed by metal, in which cooling fluid introducing channels each provided so as to reach an inlet opening portion, which introduces cooling fluid, and one end of an area connected to the inlet opening portion and corresponding to the end portion, cooling fluid draining channels each provided so as to reach an outlet opening portion, which drains cooling fluid, and the other end of the area connected to the outlet opening portion and corresponding to the end portion, cooling channels communicating from the one end to the other end of the area corresponding to the longitudinal direction of the cooled body, and branching dividers each having a gap at one end of the cooling channel are provided alternately, and which cools the cooled body by flowing cooling fluid through the cooling channels; and
   a third plate-like member to which a cooling channel is provided, having dividers positioned such that positions of the gaps are alternate and overlapped with the dividers in the second plate-like member when the third plate-like member is laminated with the second plate-like member.

7. The cooling device according to claim 6 wherein the second plate-like member and the third plate-like member are laminated alternately a plurality of times.

8. A semiconductor laser light source device, comprising:
   a cooling device, including a first plate-like member made of metal to which a cooled body is joined along the predetermined end portion, a second plate-like member made of metal in which a cooling fluid introducing channel provided so as to reach an inlet opening portion which introduces cooling fluid and one end of an area connected to the;
   the inlet opening portion and corresponding to the end portion and a cooling fluid draining channel provided so as to reach an outlet opening portion which drains cooling fluid and the other end of the area connected to the outlet opening portion and corresponding the end portion are formed, and a third plate-like member made of metal which is formed along the area corresponding to the end portion and to which at least one cooling channel is provided through which cooling fluid flows straight in the longitudinal direction of the cooled body by communicating the cooling fluid introducing channel and the cooling fluid draining channel; and
   a semiconductor laser on the cooled body.

9. The semiconductor laser light source device according to claim 8 wherein a submount constructed by using an alloy of copper (Cu) and high melting point metal are mounted between the semiconductor laser and the first plate-like member.

10. The semiconductor laser light source device according to claim 8, comprising:
    a first feeding plate-like member, which is attached under the cooling device and which has a first feeding terminal; and
    a second feeding plate-like member, which is fixed on the cooling device through an insulator and which has one end having a lamella made of metal electrically connected to the top portion of the semiconductor laser and has the other end to which a second feeding terminal is provided.

11. A semiconductor laser light source unit, comprising:
    a semiconductor laser light source device according to claim 10; and a cooling fluid manifold attached to the cooling device through a seal member by using a fastening member for supplying cooling fluid to the cooling device.

12. The semiconductor laser light source unit according to claim 11 wherein the plurality of cooling devices are arranged.

13. The semiconductor laser light source unit according to claim 11, comprising:
   a first load-dispatching board, which is cross-linked so as to electrically connect the plurality of first feeding terminals of the plurality of cooling devices; and
   a second load-dispatching board, which is cross-linked so as to electrically connecting the plurality of second feeding terminals.

14. The semiconductor laser light source unit according to claim 11 wherein cooling fluid flows independently frau the plurality of cooling devices.

15. The semiconductor laser light source unit according to claim 11 wherein cooling fluid flows through each of the cooling devices sequentially among the plurality of cooling devices.

* * * * *